(12) United States Patent
Hoshi et al.

(10) Patent No.: US 9,345,126 B2
(45) Date of Patent: May 17, 2016

(54) SEMICONDUCTOR PACKAGE AND PRINTED CIRCUIT BOARD

(71) Applicant: CANON KABUSHIKI KAISHA, Tokyo (JP)

(72) Inventors: Sou Hoshi, Miura (JP); Nobuaki Yamashita, Yokohama (JP); Yusuke Murai, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 184 days.

(21) Appl. No.: 14/198,718

(22) Filed: Mar. 6, 2014

(65) Prior Publication Data

US 2014/0268586 A1 Sep. 18, 2014

(30) Foreign Application Priority Data

Mar. 13, 2013 (JP) ................................. 2013-049835

(51) Int. Cl.
*H01L 23/02* (2006.01)
*H05K 1/02* (2006.01)
*H01L 23/50* (2006.01)
*H01L 23/66* (2006.01)
*H01L 23/00* (2006.01)
*H01L 23/498* (2006.01)
*H05K 1/16* (2006.01)
*H05K 3/46* (2006.01)

(52) U.S. Cl.
CPC ........ *H05K 1/0224* (2013.01); *H01L 23/49838* (2013.01); *H01L 23/50* (2013.01); *H01L 23/49827* (2013.01); *H01L 23/66* (2013.01); *H01L 24/05* (2013.01); *H01L 24/06* (2013.01); *H01L 24/13* (2013.01); *H01L 24/16* (2013.01); *H01L 24/48* (2013.01); *H01L 24/49* (2013.01); *H01L 2223/6655* (2013.01); *H01L 2224/0401* (2013.01); *H01L 2224/04042* (2013.01); *H01L 2224/05553* (2013.01); *H01L 2224/06135* (2013.01); *H01L 2224/131* (2013.01); *H01L 2224/16225* (2013.01); *H01L 2224/48091* (2013.01); *H01L 2224/48227* (2013.01); *H01L 2224/48233* (2013.01); *H01L 2224/49171* (2013.01); *H01L 2924/00014* (2013.01); *H01L 2924/15311* (2013.01); *H01L 2924/3011* (2013.01); *H01L 2924/30107* (2013.01); *H05K 1/0231* (2013.01); *H05K 1/162* (2013.01); *H05K 1/165* (2013.01); *H05K 1/167* (2013.01); *H05K 3/4644* (2013.01); *H05K 2201/09263* (2013.01); *H05K 2201/09672* (2013.01)

(58) Field of Classification Search
USPC .......................... 257/678, 691, 773; 361/728
See application file for complete search history.

(56) References Cited

U.S. PATENT DOCUMENTS

| 7,466,560 | B2 * | 12/2008 | Hayashi et al. | ............... 361/784 |
| 2004/0124511 | A1 * | 7/2004 | Li | ................................. 257/678 |
| 2008/0079136 | A1 * | 4/2008 | Li | ................................. 257/691 |

FOREIGN PATENT DOCUMENTS

JP 2010-251373 11/2010

*Primary Examiner* — Telly Green
(74) *Attorney, Agent, or Firm* — Fitzpatrick, Cella, Harper & Scinto

(57) ABSTRACT

A substrate of a semiconductor package comprises a conductor pattern which is formed in a surface layer, and is electrically connected to one terminal out of a power terminal and a ground terminal of a semiconductor element. The substrate also comprises in the surface layer a conductor pattern which is arranged while being separated from the conductor pattern, and a conductor pattern which is formed so as to have a wiring width thinner than that of the conductor pattern and connects the conductor pattern with the conductor pattern. The substrate also comprises a conductor pattern which is formed in an inner layer, faces the conductor pattern through a dielectric and is electrically connected to the other terminal out of the power terminal and the ground terminal of the semiconductor element.

7 Claims, 16 Drawing Sheets

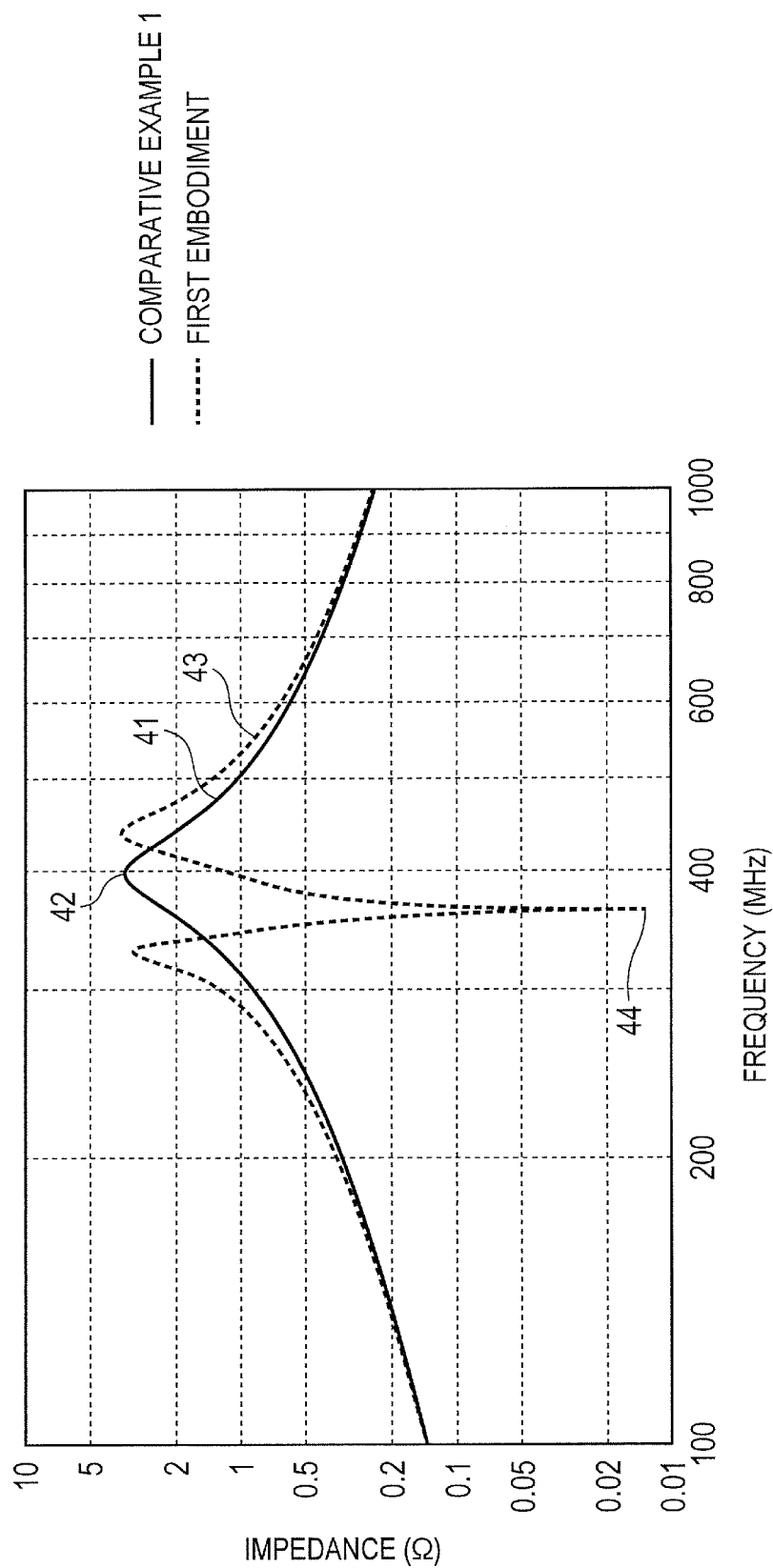

SEMICONDUCTOR PACKAGE AND PRINTED CIRCUIT BOARD

BACKGROUND OF THE INVENTION

1. Field of the Invention

The present invention relates to a semiconductor package having a semiconductor element and an interposer, and a printed circuit board having the semiconductor package and a printed wiring board.

2. Description of the Related Art

A semiconductor package has a semiconductor integrated circuit (LSI: Large-Scale Integration) which is a semiconductor element, and an interposer (package substrate) on which the LSI is mounted, and is operated by being mounted on a printed wiring board. A power supply circuit which supplies a direct current voltage necessary for the operation to the semiconductor package is mounted on the printed wiring board, and supplies the direct current voltage to the semiconductor package through the power line of the printed wiring board. An inductance component is contained in the power line, and when a current has passed through the power line, a power supply voltage occasionally fluctuates. In order to suppress the fluctuation of the power supply voltage which is supplied from this power supply circuit, it is common to provide a bypass capacitor between the power terminal and the ground terminal of the semiconductor package.

On the other hand, when the LSI is operated, a current due to the operation of the LSI passes sequentially through a power supplying route of the LSI, the package substrate, and the printed wiring board, the fluctuation of the power supply voltage occurs which is determined by a product of a power supply impedance that is parasitic characteristics of the power supplying route and the current that passes through the power supplying route. In a power supplying structure having the bypass capacitor, a capacitance component of the LSI and a parasitic inductance component that exists between the LSI and the bypass capacitor mounted on the printed wiring board form a parallel resonant circuit, which causes anti-resonance in a frequency band of the order of MHz and increases the power supply impedance. When the anti-resonance frequency has coincided with the operating frequency of the LSI, the power supply impedance of the anti-resonance frequency increases, and accordingly there are concerns that the large fluctuation of the power supply voltage occurs and causes the LSI to malfunction. Accordingly, in order to prevent the malfunction of the LSI, it is important to reduce an anti-resonance peak value of the power supply impedance of the MHz band.

Thus, Japanese Patent Application Laid-Open No. 2010-251373 describes a method of reducing the peak value of the anti-resonance of the power supply impedance, by mounting on the printed wiring board a capacitor which has a self-resonant frequency close to the anti-resonance frequency of the power supply impedance in the power supplying structure.

However, in the conventional example described in Japanese Patent Application Laid-Open No. 2010-251373, the capacitor element must be separately added in addition to the bypass capacitor in order to reduce the power supply impedance, and there has been a problem that the cost and the mounted area increase.

SUMMARY OF THE INVENTION

An object of the present invention is to provide a semiconductor package and a printed circuit board which can reduce an anti-resonance peak value of a power supply impedance, even without adding a capacitor element thereto.

A semiconductor package of the present invention comprises an interposer; and a semiconductor element mounted on the interposer, wherein the interposer comprises a plurality of conductor layers comprising a first conductor layer comprising a first conductor pattern which is electrically connected to one terminal out of a power terminal and a ground terminal of the semiconductor element; a second conductor pattern which is arranged while being separated from the first conductor pattern; and a third conductor pattern which is formed so as to have a wiring width thinner than that of the second conductor pattern, and connects the first conductor pattern with the second conductor pattern; and a second conductor layer, which is adjacent to the first conductor layer through a first dielectric, having a fourth conductor pattern which faces the second conductor pattern through the first dielectric and is electrically connected to the other terminal out of the power terminal and the ground terminal of the semiconductor element.

Further features of the present invention will become apparent from the following description of exemplary embodiments with reference to the attached drawings.

BRIEF DESCRIPTION OF THE DRAWINGS

FIG. 4 is a graph illustrating a result of a simulation for power supply impedances of the first embodiment and Comparative Example 1.

DESCRIPTION OF THE EMBODIMENTS

Preferred embodiments of the present invention will now be described in detail in accordance with the accompanying drawings.

First Embodiment

Figure 1A:
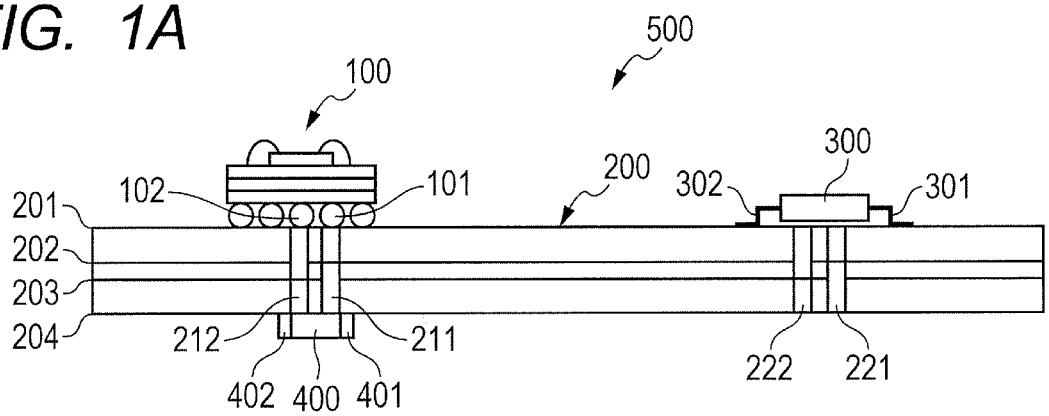
FIGS. 1A, 1B and 1C are explanatory views illustrating a schematic structure of a printed circuit board having a semiconductor package according to a first embodiment.
Figure 1B:
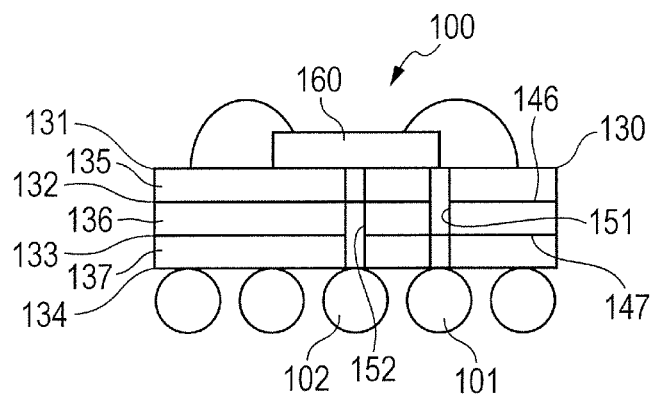
Figure 1C:
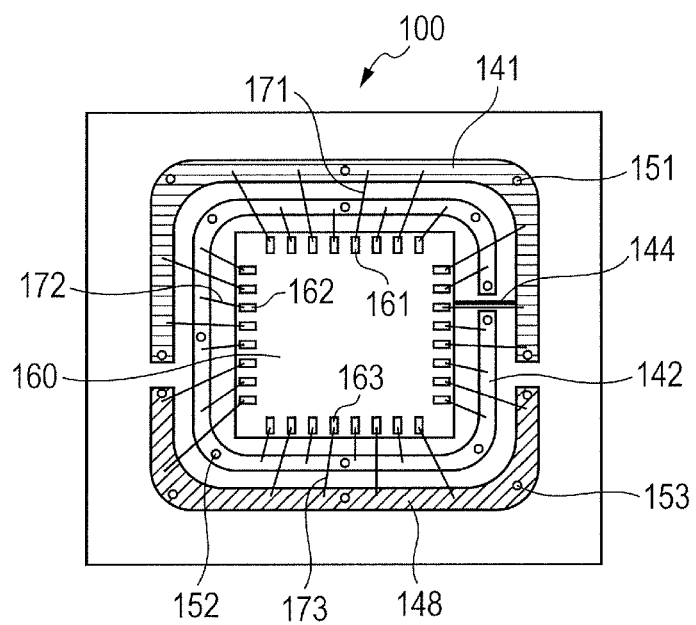

FIG. 1A to FIG. 1C are explanatory views illustrating a schematic structure of a printed circuit board having a semiconductor package according to a first embodiment of the present invention. FIG. 1A is a cross-sectional view of the printed circuit board. FIG. 1B is a cross-sectional view of the semiconductor package. FIG. 1C is a plan view of the semiconductor package.

A printed circuit board 500 comprises a printed wiring board 200, a semiconductor package 100 which is mounted on the printed wiring board 200, a power supply circuit 300 which is mounted on the printed wiring board 200, and a bypass capacitor 400 which is mounted on the printed wiring board 200.

The printed wiring board 200 that is a mother board is a multilayer (four layers) substrate in which a surface layer 201, a surface layer 204 arranged in an opposite side of the surface layer 201, and a plurality of inner layers 202 and 203 arranged between the surface layer 201 and the surface layer 204 are stacked while having dielectrics (insulators) interposed therebetween. Each of the layers 201, 202, 203 and 204 is a conductor layer in which a conductor is arranged.

The inner layer 202 has a power supply conductor pattern formed thereon, and the inner layer 203 has a ground conductor pattern formed thereon. The printed wiring board 200 has through-hole vias 211 and 221 formed therein which are electrically connected to the power supply conductor pattern of the inner layer 202, and has through-hole vias 212 and 222 formed therein which are electrically connected to the ground conductor pattern of the inner layer 203.

The semiconductor package 100 is a semiconductor package of, for instance, a BGA (Ball grid array) type, and is mounted on the surface layer 201 of the printed wiring board 200. In addition, the semiconductor package 100 is arranged in the vicinity of the vias 211 and 212.

The semiconductor package 100 has a power terminal 101 and a ground terminal 102 which are each formed of a solder ball. The power terminal 101 of the semiconductor package 100 is electrically connected to the power supply conductor pattern of the inner layer 202 through the via 211, and the ground terminal 102 is electrically connected to the ground conductor pattern of the inner layer 203 through the via 212.

The power supply circuit 300 is a circuit for supplying a direct current voltage necessary for the operation of the semiconductor package 100 to the semiconductor package 100, and is mounted on the surface layer 201 of the printed wiring board 200. In addition, the power supply circuit 300 is arranged in the vicinity of the vias 221 and 222.

A power terminal 301 of the power supply circuit 300 is electrically connected to the power supply conductor pattern of the inner layer 202 through the via 221, and a ground terminal 302 is electrically connected to the ground conductor pattern of the inner layer 203 through the via 222. Thereby, the power terminal 301 of the power supply circuit 300 and the power terminal 101 of the semiconductor package 100 are electrically connected to each other through the printed wiring board 200. In addition, the ground terminal 302 of the power supply circuit 300 and the ground terminal 102 of the semiconductor package 100 are electrically connected to each other through the printed wiring board 200.

The bypass capacitor 400 is formed of a single capacitor or a plurality of capacitor elements (for instance, capacitor chip), and is mounted on the surface layer 204 of the printed wiring board 200. In addition, the bypass capacitor 400 is arranged in the vicinity of the semiconductor package 100, in other words, in the vicinity of the vias 211 and 212. In the bypass capacitor 400, one terminal 401 is electrically connected to a power line (via 211 in FIG. 1A) of the printed wiring board 200, and the other terminal 402 is electrically connected to a ground line (via 212 in FIG. 1A) of the printed wiring board 200.

The semiconductor package 100 comprises, as is illustrated in FIG. 1B, an interposer (which is also referred to as package substrate, and is hereafter referred to as "substrate") 130, and an LSI (Large-Scale Integration) 160 which is a semiconductor element mounted on the substrate 130.

The substrate 130 is a multilayer (four layers) substrate in which a surface layer 131, a surface layer 134 arranged in an opposite side of the surface layer 131, and a plurality of inner layers 132 and 133 arranged between the surface layer 131 and the surface layer 134 are stacked while having dielectrics (insulators) 135, 136 and 137 interposed therebetween. Each of the layers 131, 132, 133 and 134 is a conductor layer in which a conductor is arranged.

The inner layer 132 is a conductor layer which is adjacent to the surface layer 131 through the dielectric 135, and the inner layer 133 is a conductor layer which is arranged in an opposite side of the side of the surface layer 131 across the inner layer 132 and is adjacent to the inner layer 132 through the dielectric 136. In the present embodiment, the surface layer 131 is a first conductor layer, the inner layer 132 is a second conductor layer, the inner layer 133 is a third conductor layer, and the surface layer 134 is a fourth conductor layer. In addition, in the present embodiment, the dielectric 135 is a first dielectric, the dielectric 136 is a second dielectric, and the dielectric 137 is a third dielectric. The power terminal 101 and the ground terminal 102 are arranged on the surface layer 134.

The LSI 160 is mounted on the surface layer 131 of the substrate 130. Specifically, the LSI 160 is fixed to the surface layer 131 of the substrate 130 by an adhesive or the like.

The LSI 160 has a plurality of power terminals 161 to which a direct current voltage is applied, and a plurality of ground terminals 162 which is set at a ground potential, as is illustrated in FIG. 1C.

In the present embodiment, the LSI 160 is operated by a plurality of different direct current voltages. Accordingly, the LSI 160 has a plurality of power terminals 163 to which a different direct current voltage from that of the power terminal 161 is applied. Incidentally, the LSI 160 has not-illustrated signal terminals and the like, in addition to these terminals 161 to 163.

Figure 2A:
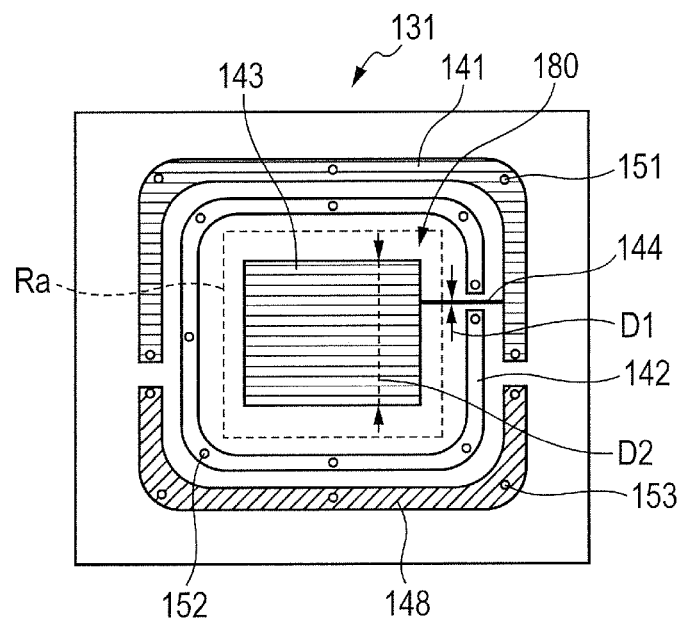
FIGS. 2A and 2B are schematic views illustrating an interposer of the semiconductor package according to the first embodiment.
Figure 2B:
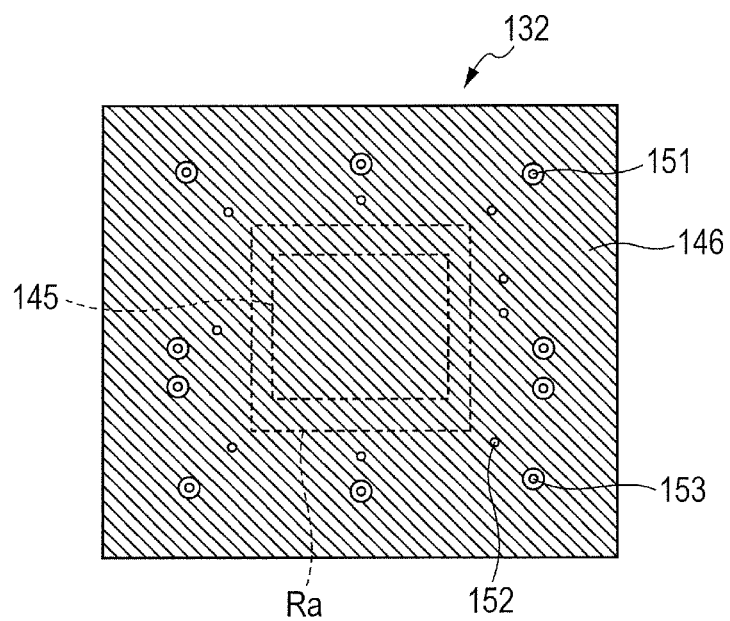

FIG. 2A and FIG. 2B are schematic views illustrating the substrate 130; FIG. 2A is a plan view of the surface layer 131 of the substrate 130; and FIG. 2B is a plan view of the inner layer 132 of the substrate 130. The substrate 130 has a power supply conductor pattern 141 that is the first conductor pattern which is formed in the surface layer 131 and to which one terminal out of the power terminal 161 and the ground terminal 162 of the LSI 160, which is the power terminal 161 in the present embodiment, is electrically connected. In addition, the substrate 130 has a ground conductor pattern 142 that is formed in the surface layer 131, and to which the ground terminal 162 of the LSI 160 is electrically connected. In addition, the substrate 130 has a conductor pattern 143 that is the second conductor pattern, and a conductor pattern 144 that is the third conductor pattern, which are formed in the surface layer 131. In addition, the substrate 130 has a ground conductor pattern 146 which is formed in the inner layer 132 and has a conductor pattern 145 that is the fourth conductor pattern to which the other terminal out of the power terminal and the ground terminal of the LSI 160, which is the ground terminal 162 in the present embodiment, is electrically connected. In addition, the substrate 130 has a power supply conductor pattern 147 (FIG. 1B) which is a conductor pattern formed in the inner layer 133. In addition, the substrate 130 has a power supply conductor pattern 148 which is a conductor pattern formed in the surface layer 131.

The conductor patterns 141, 142 and 143 are arranged in the surface layer 131 while being separated from each other. In addition, the conductor pattern 144 in the surface layer 131 electrically connects the power supply conductor pattern 141 with the conductor pattern 143.

The power terminal 161 of the LSI 160 is electrically connected to the power supply conductor pattern 141 of the surface layer 131, by a bonding wire 171, as is illustrated in FIG. 1C. The ground terminal 162 of the LSI 160 is electrically connected to the ground conductor pattern 142 of the surface layer 131, by a bonding wire 172. Incidentally, the power terminal 163 of the LSI 160 is electrically connected to the power supply conductor pattern 148 of the surface layer 131, by a bonding wire 173.

The power supply conductor pattern 141 of the surface layer 131 is electrically connected to the power supply conductor pattern 147 of the inner layer 133 and the power terminal 101 on the surface layer 134, by a via 151. In other words, the power terminal 101 is electrically connected to the power terminal 161 of the LSI 160 through the via 151, the power supply conductor pattern 141 and the bonding wire 171.

The ground conductor pattern 142 in the surface layer 131 is electrically connected to the ground conductor pattern 146 of the inner layer 132 and the ground terminal 102 on the surface layer 134, by a via 152. In other words, the ground conductor pattern 146 (conductor pattern 145) of the inner layer 132 is electrically connected to the ground conductor pattern 142 in the surface layer 131 and the ground terminal 102 on the surface layer 134, through the via 152. In addition, the ground conductor pattern 146 (conductor pattern 145) of the inner layer 132 is electrically connected to the ground terminal 162 of the LSI 160, through the via 152, the ground conductor pattern 142 and the bonding wire 172. Accordingly, the ground terminal 102 is electrically connected to the ground terminal 162 of the LSI 160 through the via 152, the ground conductor pattern 142 and the bonding wire 172.

Incidentally, the power supply conductor pattern 148 in the surface layer 131 is arranged while being separated from the conductor patterns 141 to 144, and is electrically connected to a not-illustrated conductor pattern of the inner layer 133 and a not-illustrated power terminal of the surface layer 134, by a via 153.

In the present embodiment, the power supply conductor patterns 141 and 148 of the surface layer 131 are formed into approximately a U-shape, and are arranged so that the ends of the patterns face each other. The ground conductor pattern 142 is arranged in a region surrounded by these power supply conductor patterns 141 and 148. The ground conductor pattern 142 is formed into such a shape that a part of a ring shape is cut out and divided, in other words, into approximately a C-shape. The conductor pattern 143 is arranged in a region surrounded by the ground conductor pattern 142, and the power supply conductor pattern 141 and the conductor pattern 143 are electrically connected by the conductor pattern 144 through a cutout portion of the ground conductor pattern 142.

The ground conductor pattern 146 of the inner layer 132 is a conductor pattern which has a plane-shape and is formed in the approximately whole of the inner layer 132. The conductor pattern 143 of the surface layer 131 and the conductor pattern 145 which is a part of the ground conductor pattern 146 face each other through the dielectric 135. In other words, portions in which the conductor patterns face each other through the dielectric 135 are the conductor pattern 143 which is the second conductor pattern, and the conductor pattern 145 which is the fourth conductor pattern.

In the present embodiment, the conductor pattern 145 is a conductor pattern formed in a projected region which corresponds to the conductor pattern 143 projected onto the inner layer 132. A pair of these conductor patterns 143 and 145 functions as a parallel flat-plate capacitor which has mainly a capacitance component (C component) and a resistance component (R component).

In addition, the conductor pattern 144 is a linear conductor pattern, and the wiring width D1 is narrower than a wiring width D2 of the conductor pattern 143. Accordingly, the conductor pattern 144 functions as an inductor which has mainly an inductance component (L component) and a resistance component (R component).

In other words, the printed wiring board 200 has a pattern unit 180 which constitutes a series resonant circuit that is formed of the conductor patterns 143, 144 and 145 and has LCR components.

In the present embodiment, the conductor pattern 143 is arranged in a position at which the conductor pattern 143 faces the LSI 160. In other words, the conductor pattern 143 is arranged so that a part or the whole of the conductor pattern 143 (whole in FIG. 2A) exists within the projected region Ra which corresponds to the LSI 160 projected onto the surface layer 131. Thereby, it becomes unnecessary to secure a region for providing the conductor pattern 143 in another region than the projected region Ra on the surface layer 131, which enables the miniaturization of the sizes of not only the substrate 130 but also the semiconductor package 100 to be maintained.

The resonance frequency of the above pattern unit 180 which forms a series resonant circuit is brought close to the anti-resonance frequency caused by the LSI 160, the substrate 130, the printed wiring board 200 and the bypass capacitor 400. Thereby the power supply impedance in the anti-resonance can be reduced.

Figure 15A:
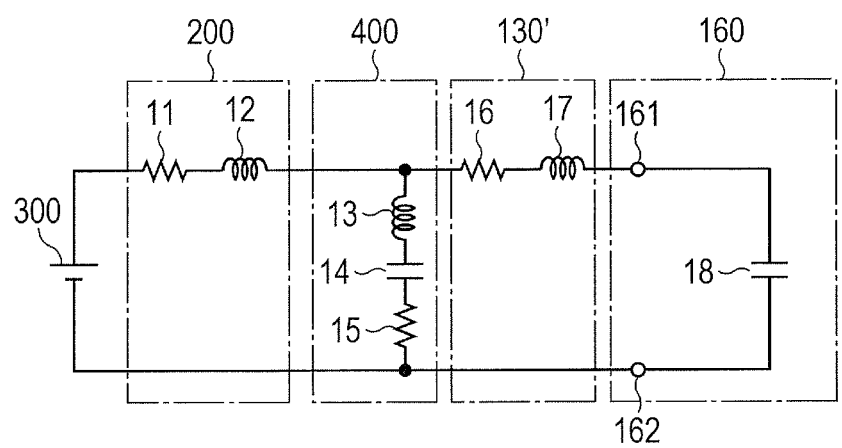
FIGS. 15A and 15B are equivalent circuit diagrams illustrating a power supplying route of a printed circuit board of Comparative Example 1.
Figure 15B:
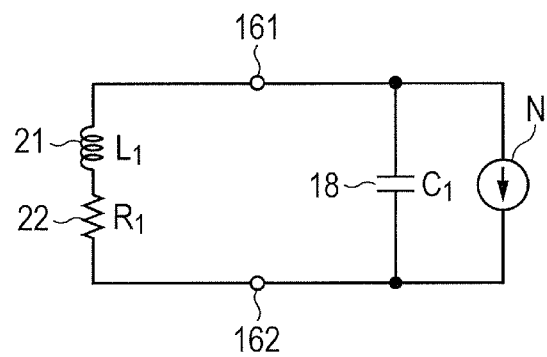

A principle of reducing the power supply impedance will be described below. FIG. 15A and FIG. 15B are equivalent circuit diagrams illustrating a power supplying route of a printed circuit board of Comparative Example 1. These FIG. 15A and FIG. 15B are equivalent circuit diagrams of the power supplying route of the printed circuit board which does not have the pattern unit 180 of the present embodiment.

FIG. 15A is an equivalent circuit diagram of the power supplying route of the printed circuit board when viewed from the side of a power supply circuit 300. The power line of a printed wiring board 200 is considered to be a circuit in which a parasitic resistance component 11 and a parasitic inductance component 12 of the power line are connected in series. The bypass capacitor 400 is considered to be a circuit in which a parasitic inductance component 13 including ESL, a parasitic resistance component 15 including ESR, and a capacitor component 14 which indicates the total capacitance of the capacitors are connected in series. The power line (conductor pattern, via and the like) of the substrate 130' of the semiconductor package is considered to be a circuit in which a parasitic resistance component 16 and a parasitic inductance component 17 are connected in series. In addition, the LSI 160 is considered to have a capacitance component 18.

Incidentally, the parasitic capacitance between the power line and the ground line of the printed wiring board 200 and the substrate 130' exerts little influence on the power supply impedance in the MHz band, and accordingly is omitted. For a similar reason, the parasitic resistance component and the parasitic inductance component of the power line and the ground line of the LSI 160 are also omitted.

FIG. 15B is an equivalent circuit diagram of the printed circuit board when the LSI 160 is supposed as a noise source N of the MHz band or higher. As is illustrated in FIG. 15B, suppose that the noise source N having a frequency band of 1 [MHz] or higher as a frequency is connected to the power terminal 161 and the ground terminal 162 of the LSI 160.

The sum of the parasitic inductance component 13 of the bypass capacitor 400 and the parasitic inductance component 17 of the substrate 130' is determined to be a parasitic inductance component 21, and the sum of the parasitic resistance component 15 of the bypass capacitor 400 and the parasitic resistance component 16 of the substrate 130' is determined to be a parasitic resistance component 22.

Incidentally, when the capacitance component 14 of the bypass capacitor 400 is set at an order of μF, the impedance of the capacitance component 14 is so low as to be neglected with respect to the impedance of the parasitic inductance component 21, in a frequency band of 1 MHz or higher, and can be considered to be a short circuit in an AC circuit. Accordingly, the capacitance component 14 is omitted in FIG. 15B.

In addition, the power supply circuit 300 is considered to be opened in an AC circuit in a frequency band of 1 MHz or higher. Accordingly, in FIG. 15B, the power supply circuit 300, the parasitic resistance component 11 and the parasitic inductance component 12 are omitted.

As is illustrated in FIG. 15B, the circuit is considered to be a parallel resonant circuit for the noise source N, which is formed of an inductance $L_1$ of the parasitic inductance component 21, a resistance $R_1$ of the parasitic resistance component 22, and a capacitance $C_1$ of the capacitance component 18 of the LSI 160.

When an impedance of a power supplying route when the side of the power supply circuit 300 is viewed from the noise source N (specifically LSI 160) is considered to be a power supply impedance, the power supply impedance shows a peak value in an anti-resonance point (anti-resonance frequency). When this anti-resonance frequency coincides with an operating frequency of the LSI 160, the power supply impedance shows a peak value, and accordingly a large fluctuation of the power supply voltage occurs at the time.

Thus, in the present embodiment, the substrate 130 of the semiconductor package 100 has a pattern unit 180 which constitutes a series resonant circuit that reduces the peak value in the anti-resonance frequency of this power supply impedance.

Figure 3A:
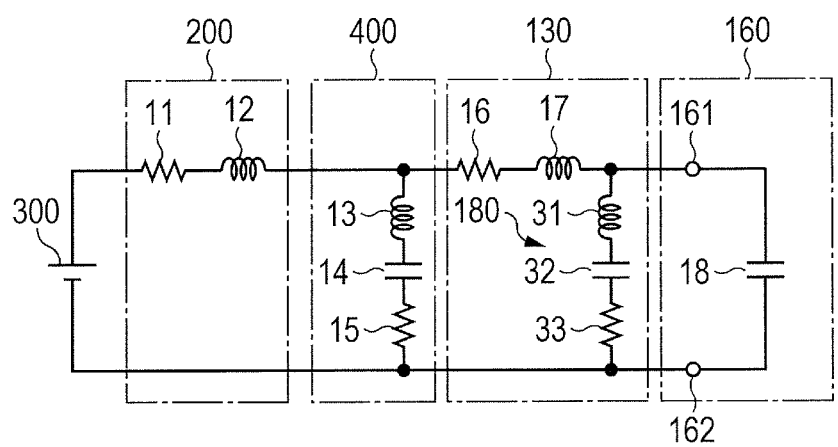
FIGS. 3A and 3B are equivalent circuit diagrams illustrating a power supplying route of a printed circuit board according to the first embodiment.
Figure 3B:
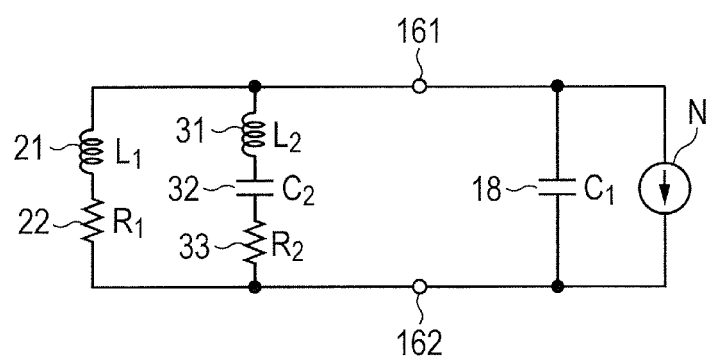

FIG. 3A and FIG. 3B are equivalent circuit diagrams illustrating a power supplying route of the printed circuit board 500 according to the first embodiment of the present invention. FIG. 3A is an equivalent circuit diagram of the power supplying route of the printed circuit board 500 when viewed from the side of the power supply circuit 300.

The pattern unit 180 is a series circuit of a resistance component 33 of the conductor patterns 143, 144 and 145, an inductance component 31 of the conductor patterns 143, 144 and 145 (mainly, conductor pattern 144), and a capacitance component 32 between the conductor patterns 143 and 145.

FIG. 3B is an equivalent circuit diagram of the printed circuit board when the LSI 160 is supposed as a noise source N of the MHz band or higher. As is illustrated in FIG. 3B, suppose that the noise source N having a frequency band of 1 [MHz] or higher as a frequency is connected to the power terminal 161 and the ground terminal 162 of the LSI 160.

Incidentally, similarly to Comparative Example 1, the capacitance component 14, the power supply circuit 300, the parasitic resistance component 11 and the parasitic inductance component 12 are omitted. Incidentally, similarly to Comparative Example 1, the sum of the parasitic inductance component 13 and the parasitic inductance component 17 is determined to be the parasitic inductance component 21, and the sum of the parasitic resistance component 15 and the parasitic resistance component 16 is determined to be the parasitic resistance component 22.

When the side of the power supply circuit 300 is viewed from the noise source N, the power supply route of the printed circuit board 500 forms an equivalent circuit in which a parallel resonant circuit formed of the components 18, 21 and 22 and a series resonant circuit formed of the components 31, 32 and 33 are connected in parallel.

Here, suppose that an inductance of the inductance component 31 is represented by $L_2$, a capacitance of the capacitance component 32 is represented by $C_2$, and a resistance of the resistance component 33 is represented by $R_2$. The values $L_1, C_1, R_1, L_2, C_2$ and $R_2$ were set at values in the following Table 1, respectively, and a circuit simulation was performed by using Hspice made by Synopsys, Inc. Incidentally, the values illustrated in Table 1 are representative values of a standard printed wiring board and a standard package substrate.

TABLE 1

| Circuit Element | Circuit Constant |
| --- | --- |
| $L_1$ | 200 pH |
| $C_1$ | 792 pF |
| $R_1$ | 10 mΩ |
| $L_2$ | 2.9 nH |
| $C_2$ | 66 pF |
| $R_2$ | 10 mΩ |

FIG. 4 is a graph illustrating a result of a simulation for power supply impedances in equivalent circuit models of printed circuit boards of the first embodiment and Comparative Example 1.

A curve 41 illustrated in FIG. 4 is a power supply impedance which is viewed from terminals 161 and 162, when the values have been set at values described in Table 1, respectively, in the equivalent circuit model of the printed circuit board of Comparative Example 1 illustrated in FIG. 15B.

In the curve 41 of the power supply impedance, an anti-resonance 42 due to parallel resonance originating in the inductance component 21 and the capacitance component 18 of the LSI appears in the vicinity of 400 [MHz]. When the operating frequency of the LSI has coincided with a frequency at which the anti-resonance 42 occurs, in other words, with the anti-resonance frequency, the power supply impedance of the anti-resonance frequency becomes high. Accordingly, a large fluctuation of the power supply voltage occurs due to the product of the operating current of the LSI and the power supply impedance.

On the other hand, a curve 43 illustrated in FIG. 4 shows characteristics of the power supply impedance which is viewed from the terminals 161 and 162, when the values have set at values described in Table 1, respectively, in the equivalent circuit model of the printed circuit board 500 of the first embodiment illustrated in FIG. 3B.

An LCR circuit of the inductance component 31 between the power supply and the ground, the capacitance component 32 and the resistance component 33, particularly an LC circuit of the inductance component 31 and the capacitance component 32, causes series resonance at a frequency which is close to the parallel resonance frequency of the inductance component 21 and the capacitance component 18. Because of this, the added components 31 and 32 function as a current route with a low power supply impedance in the vicinity of the parallel resonance frequency. As a result, in the curve 43 which indicates the power supply impedance, the resonance 44 has occurred in the vicinity of 400 [MHz]. The power supply impedance of Comparative Example 1 is 3.5[Ω] and the power supply impedance of the first embodiment is 1.3 [Ω] at 400 [MHz]. It is understood that the configuration of the first embodiment reduces the power supply impedance of the anti-resonance 42 of Comparative Example 1.

Next, an example will be described below in which a specific effect of the present first embodiment is confirmed by a simulation. In the simulation, the CAD data of the substrate 130 for mounting the LSI 160 thereon and the printed wiring board 200 for mounting the semiconductor package 100 thereon were analyzed by an electromagnetic field simulator (PowerSI made by Sigrity, Inc.), and the power supply impedance was determined. In addition, in the printed circuit board of Comparative Example 1 as well, the data were analyzed by the electromagnetic field simulator with a similar method to the above simulation method, and the power supply impedance was determined.

Figure 16:
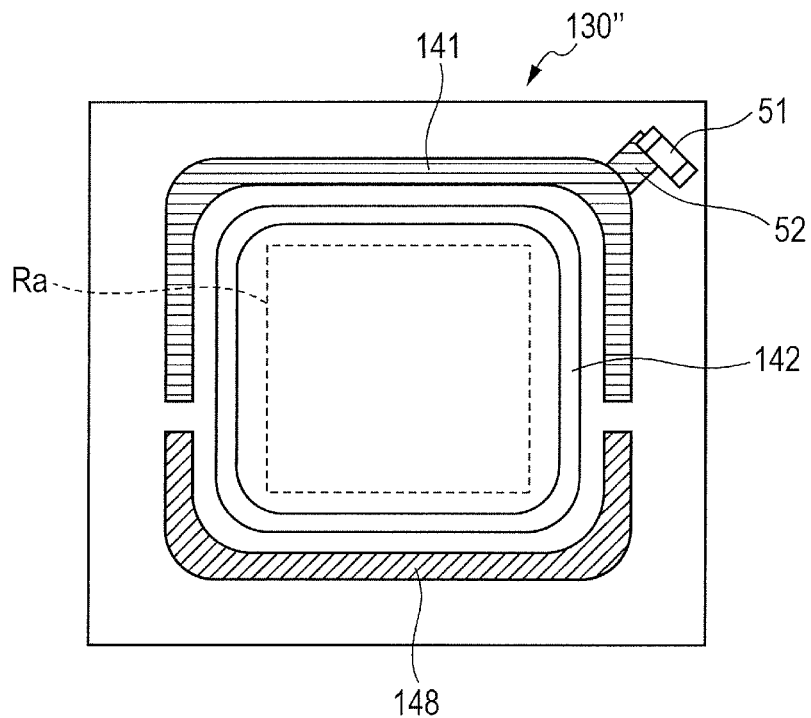
FIG. 16 is a plan view illustrating an interposer of a semiconductor package of Comparative Example 2.

Furthermore, in Comparative Example 2, a capacitor element for coping with resonance was provided on the package substrate, in place of the pattern unit 180. The power supply impedance was determined also in the case. FIG. 16 is a plan view illustrating a substrate 130″ of a semiconductor package of Comparative Example 2. Incidentally, in FIG. 16, configurations similar to those in the present first embodiment are designated by the same reference numerals, and the description will be omitted. As is illustrated in FIG. 16, the substrate 130″ of Comparative Example 2 does not have the conductor patterns 143 and 144, but has a bypass capacitor (capacitor element) 51 for coping with resonance mounted thereon instead. One terminal of the bypass capacitor 51 is connected to the power supply conductor pattern 141 by a connection wiring pattern 52. The other terminal thereof is connected to the ground conductor pattern of the inner layer through a not-illustrated via.

A space between the surface layer 131 and the inner layer 132 of the substrate 130 of the present first embodiment was set at 60 [μm], an area of the conductor pattern 143 was set at 5,175 [μm]×5,175 [μm], a wiring width of the conductor pattern 144 was set at 20 [μm], and a wiring length thereof was set at 2,379 [μm]. A conductivity of each of the conductor patterns was set at $5.8 \times 10^7$ [S/m], a relative dielectric constant of an inter-layer insulating material (dielectric) between the surface layer 131 and the inner layer 132 of the substrate 130 was set at 4.3, and a capacitance of the LSI 160 was set at 58 [pF].

In addition, the values of Comparative Example 2 were set in the following way. As for the bypass capacitor 51, the size was set at 1005 size, the capacitance was set at 30 [pF], ESL was set at 0.35 [nH], and ESR was set at 0.3[Ω]. A wiring width of the connection wiring pattern 52 was set at 0.78 [mm], and a wiring length thereof was set at 1.3 [mm]. Other conditions were determined to be similar to those in the first embodiment. In addition, in Comparative Example 1 as well, similar configurations to those in the first embodiment were determined to be the similar conditions to those.

As a result of the simulation by the simulator, a capacitance component between the conductor patterns 143 and 145 was 17 [pF], and an inductance component of the conductor pattern 144 was 1,182 [pH]. A resonance frequency of the LC circuit in the present first embodiment was 1,123 [MHz].

Figure 5:
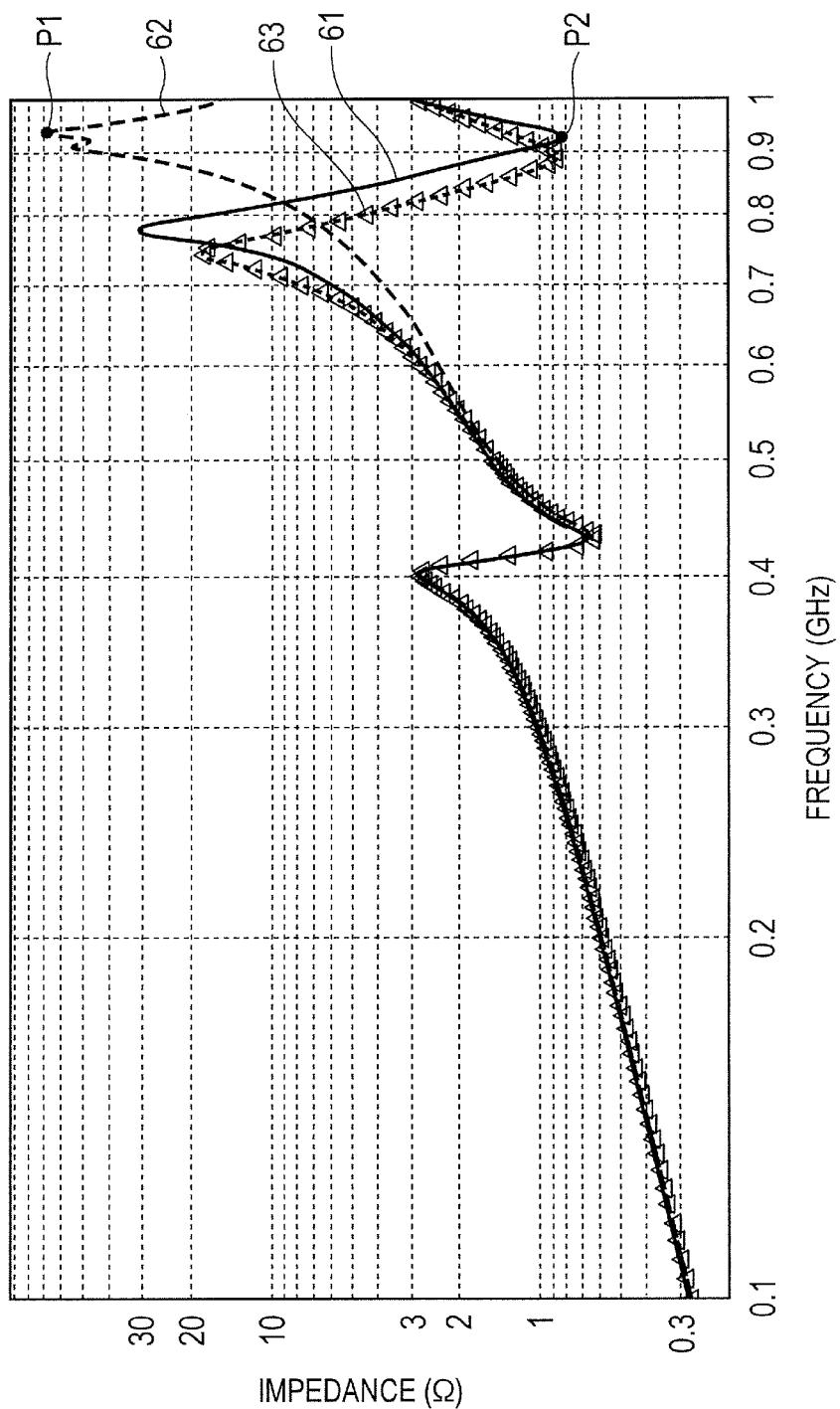
FIG. 5 is a graph illustrating a result of a simulation for power supply impedances of the first embodiment, Comparative Example 1 and Comparative Example 2.

FIG. 5 is a graph illustrating a result of a simulation for power supply impedances of the first embodiment, Comparative Example 1 and Comparative Example 2. A curve 61 shows characteristics of the power supply impedance in the present first embodiment, a curve 62 shows characteristics of the power supply impedance in Comparative Example 1, and a curve 63 shows characteristics of the power supply impedance in Comparative Example 2.

As is illustrated in the curve 62, an anti-resonance frequency in Comparative Example 1 was 940 [MHz], and a power supply impedance P1 in this anti-resonance frequency was 66.5[Ω]. On the other hand, as is illustrated in the curve 61, the power supply impedance P2 of 940 [MHz] became smaller than 1.0[Ω] by bringing the resonance frequency of the LC circuit close to 940 [MHz] in the present first embodiment. Thus, it was confirmed that the power supply impedance could be reduced.

In addition, it was confirmed that the power supply impedance of the present first embodiment had characteristics of being capable of varying similarly to the characteristics of the power supply impedance of Comparative Example 2. In other words, it has been found that the present first embodiment can provide a similar effect to that when the bypass capacitor 51 has been added, without the addition of the bypass capacitor 51. Accordingly, the present first embodiment shows a similar effect to that when the bypass capacitor 51 is added without the addition of a capacitor which is the bypass capacitor 51, in other words, shows an effect of reducing the power supply impedance.

Figure 6:
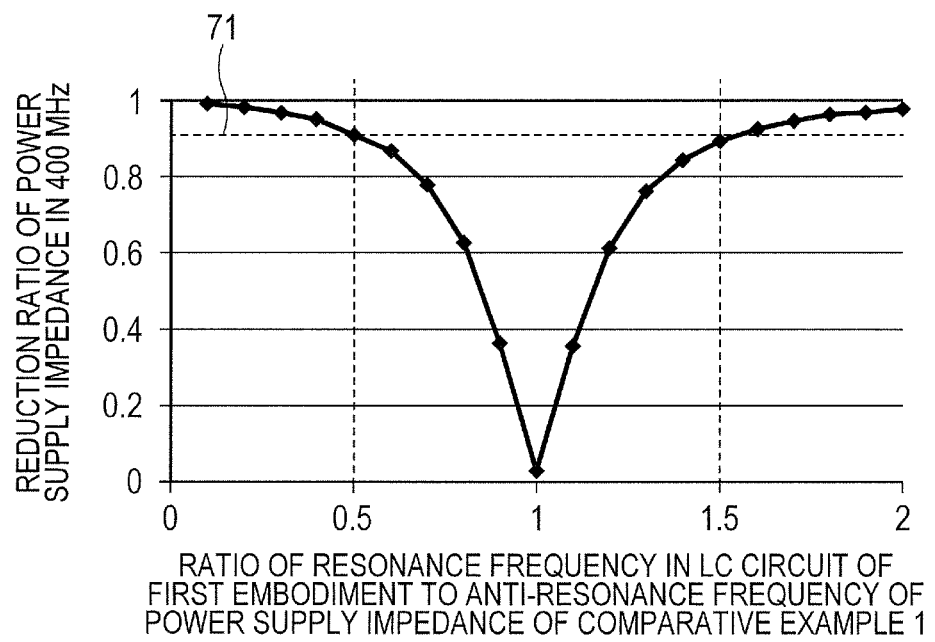
FIG. 6 is a graph illustrating a relationship between a ratio of a resonance frequency to an anti-resonance frequency of the power supply impedance, and a reduction ratio of the power supply impedance.

FIG. 6 is a graph illustrating a relationship between a ratio of a resonance frequency to an anti-resonance frequency of the power supply impedance, and a reduction ratio of the power supply impedance.

In Comparative Example 1, the bypass capacitor 400 is connected between the power line and the ground line in the printed wiring board 200, and thereby a parallel resonant circuit is formed. Accordingly, a horizontal axis in FIG. 6 shows a ratio of the resonance frequency (self-resonant frequency) of the resonance generated by the pattern unit 180 to the anti-resonance frequency of the anti-resonance generated by the bypass capacitor 400, in other words, by the parallel resonant circuit. The resonance frequency of the pattern unit 180 was varied by varying the values of $C_2$ and $L_2$.

A vertical axis shows a ratio of the power supply impedance when $C_2$ and $L_2$ of the first embodiment have been varied to the power supply impedance of Comparative Example 1, in 400 [MHz] which is close to the anti-resonance frequency when the circuit parameters in Table 1 have been applied to the equivalent circuit model of Comparative Example 1. In other words, the vertical axis shows a reduction ratio of the impedance due to the series resonance of $C_2$ and $L_2$.

A straight line 71 illustrated in FIG. 6 indicates that the reduction ratio of the power supply impedance is 10%. As is illustrated in FIG. 6, when the ratio of the self-resonant frequency to the anti-resonance frequency is not less than 0.5 and not more than 1.5, such an effect can be obtained that the reduction ratio of the power supply impedance is 10% or more, in other words, the reduction ratio of the fluctuation of the power supply voltage is 10% or more.

Thus, in order to enhance an effect of suppressing the fluctuation of the power supply voltage, it is acceptable to achieve the effect by controlling $L_2$ and $C_2$ so that the resonance frequency settles in a range of ±50% around the anti-resonance frequency determined to be the object and the center. Incidentally, the resonance frequency can have a wide range, and accordingly the values of $L_2$ and $C_2$ can be considered so as to contain the variations due to a fabrication tolerance and the like.

A method of verifying the present embodiment will be described below. In order to check the power supply impedance, firstly, a mold resin and the like which cover the LSI are melted, on the printed circuit board on which the semiconductor package that has the LSI and the package substrate is mounted. Next, a fine probe is placed on pads for bonding wires of the power supply and the ground of the LSI, in other words, on the power terminal and the ground terminal of the LSI, and the power supply impedance is measured by a network analyzer or an impedance analyzer to which the fine probe is connected. At this time, two forms of the presence or the absence of the conductor patterns 143 and 144 are measured, and thereby the change of the characteristics of the power supply impedance in the anti-resonance frequency can be checked.

Second Embodiment

Figure 7A:
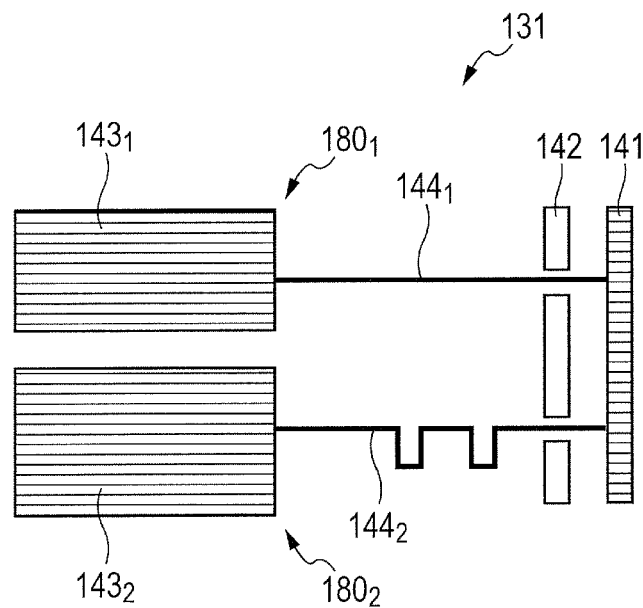
FIGS. 7A and 7B are schematic views illustrating an interposer in a semiconductor package of a printed circuit board according to a second embodiment.
Figure 7B:
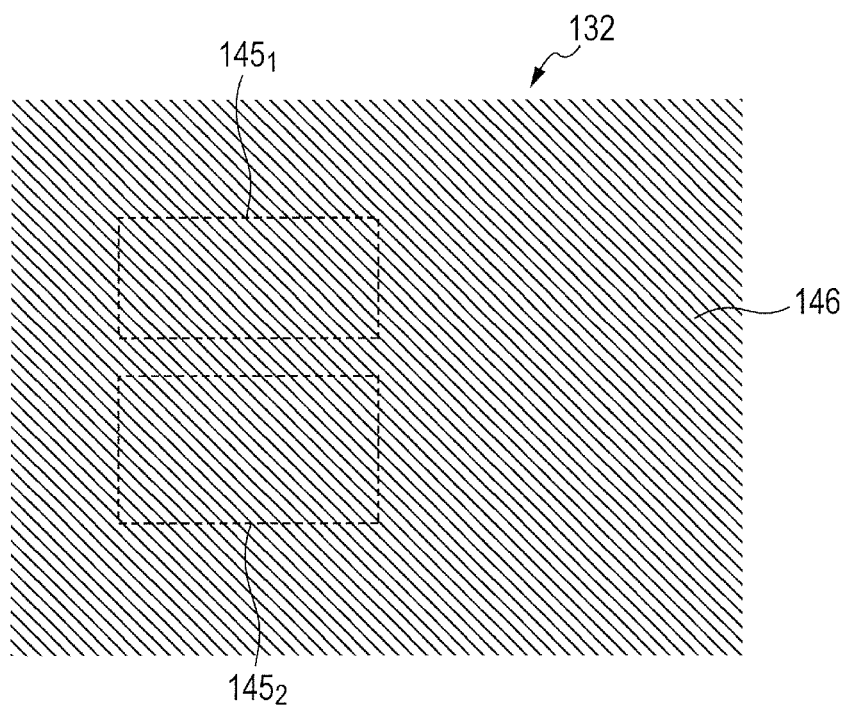

Next, a printed circuit board according to a second embodiment of the present invention will be described below. FIG. 7A and FIG. 7B are schematic views illustrating an interposer (substrate) in a semiconductor package of the printed circuit board according to the second embodiment of the present invention. Incidentally, in the present second embodiment, configurations similar to those in the above described first embodiment are designated by the same reference numerals, and the description will be omitted. FIG. 7A is a plan view of a surface layer 131 which is a first conductor layer of the substrate of the semiconductor package; and FIG. 7B is a plan view of an inner layer 132 which is a second conductor layer of the substrate of the semiconductor package.

In the above described first embodiment, the case has been described where the substrate of the semiconductor package has one pattern unit 180, but the substrate may have a plurality of pattern units 180. In the present second embodiment, the substrate has two pattern units $180_1$ and $180_2$.

The pattern unit $180_1$ has a conductor pattern $143_1$ of the second conductor pattern, a conductor pattern $144_1$ of the third conductor pattern, and a conductor pattern $145_1$ of the fourth conductor pattern. In addition, the pattern unit $180_2$ has a conductor pattern $143_2$ of the second conductor pattern, a conductor pattern $144_2$ of the third conductor pattern, and a conductor pattern $145_2$ of the fourth conductor pattern.

Each of the pattern units $180_1$ and $180_2$ can be formed so as to have a mutually different resonance frequency. For instance, each of the pattern units $180_1$ and $180_2$ may be formed so as to have mutually different capacitance $C_2$, so as to have mutually different inductance $L_2$, or so as to have mutually different $C_2$ and $L_2$ at the same time. When it is described in full detail, an area in which the conductor pattern $143_1$ faces the conductor pattern $145_1$ and an area in which the conductor pattern $143_2$ faces the conductor pattern $145_2$ may be differentiated from each other, the spaces between the conductor patterns may be differentiated from each other, or the dielectric constants of the dielectrics between the conductor patterns may be differentiated from each other. In addition, the wiring length of the conductor pattern $144_1$ and the wiring length of the conductor pattern $144_2$ may be also differentiated from each other.

Thus, when the resonance frequencies of each of the pattern units $180_1$ and $180_2$ are differentiated from each other, a wide band in which the power supply impedance is reduced can be secured and the fluctuation of the power supply voltage can be more effectively suppressed. Incidentally, in the present second embodiment, two pattern units 180 have been provided, but there may exist three or more pattern units 180.

In addition, in the present second embodiment, the plurality of conductor patterns $145_1$ and $145_2$ is integrally formed of one plane-shaped conductor. More specifically, the plurality of conductor patterns $145_1$ and $145_2$ is integrally formed in one ground conductor pattern 146. Accordingly, the potential (ground potential) in each of the conductor patterns $145_1$ and $145_2$ is stabilized, and the fluctuation of the power supply voltage can be effectively suppressed.

In addition, in the present second embodiment, the conductor pattern $144_2$ is formed into a meander-shape. Accordingly, the inductance $L_2$ can be effectively increased with a small dedicated area.

Third Embodiment

Next, a printed circuit board according to a third embodiment of the present invention will be described below. Incidentally, in the present third embodiment, the wiring configuration is similar to the wiring configuration of the above described second embodiment illustrated in FIG. 7A and FIG. 7B, but the dielectric constants (relative dielectric constants) of dielectrics 135 and 136 (see FIG. 1B) between the layers are different from each other. Specifically, the dielectric 135 has a larger dielectric constant than the dielectric 136.

Here, an example will be described below in which an effect of reducing the power supply impedance of the present third embodiment has been confirmed by a simulation. In the simulation, the CAD data of the package substrate (other than surface layer 131) and the printed wiring board, the capacitance model of the LSI, and the simulator were used, which were used in the simulation in the first embodiment, and the wiring of the surface layer 131 of the substrate was determined to be the same as in FIG. 7A.

The size of the conductor pattern $143_1$ was set at 5,175 [μm]×2,459 [μm], and the size of the conductor pattern $143_2$ was set at 5,175 [μm]×2,668 [μm]. Furthermore, a relative dielectric constant of the dielectric 135 between the surface layer 131 and the inner layer 132 of the package substrate was set at 7.0.

The capacitance $C_2$ formed by the conductor pattern $143_1$ and the conductor pattern $145_1$ was 13.1 [pF], and the capacitance $C_2$ formed by the conductor pattern $143_2$ and the conductor pattern $145_2$ was 14.3 [pF]. Incidentally, relative dielectric constants of dielectrics 136 and 137 between other layers were each set at 4.3 which was smaller than 7.0. These capacitances $C_2$ show an effect of increasing a capacitance value per unit area, compared to each of the capacitance values of 8.0 [pF] and 8.8 [pF] when the relative dielectric constant of the dielectric 135 was set at 4.3. Thereby, the areas of the conductor patterns 143 and 145 can be reduced, and a desired capacitance value can be secured even if the space is saved.

In addition, the wiring width of the conductor pattern $144_1$ was set at 40 [μm], the wiring length thereof was set at 4,133 [μm], the wiring width of the conductor pattern $144_2$ was set at 40 [μm], and the wiring length thereof was set at 6,006 [μm]. The inductances $L_2$ at this time were 1.73 [nH] and 2.51 [nH], respectively.

Figure 8:
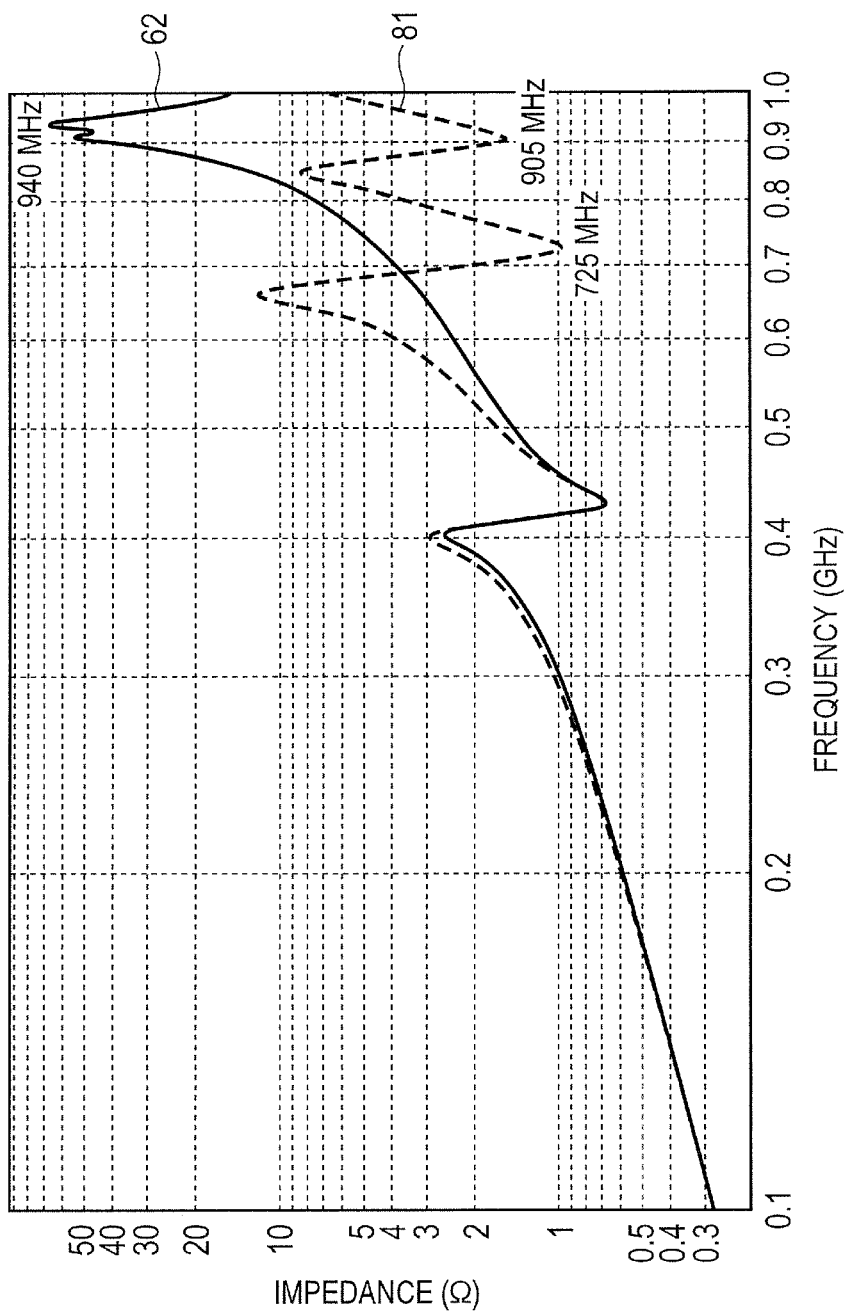
FIG. 8 is a graph illustrating a result of a simulation for power supply impedances of a third embodiment and Comparative Example 1.

FIG. 8 is a graph illustrating a result of a simulation for power supply impedances of a third embodiment and Comparative Example 1. A curve 81 shows characteristics of the power supply impedance in the present third embodiment, and a curve 62 shows characteristics of the power supply impedance of Comparative Example 1 illustrated in FIG. 5.

The structure and the parameters are the same as those in the above described first embodiment, except that the wiring structure of the surface layer 131 is formed into a structure illustrated in FIG. 7A, and a relative dielectric constant of the dielectric 135 between the surface layer 131 and the inner layer 132 is set at 7.0. As is illustrated in FIG. 8, a band of reducing the power supply impedance can be widened more than that in the above described first embodiment, by using two pattern units $180_1$ and $180_2$ (LC circuits).

Incidentally, in order to obtain an effect of enhancing the capacitance $C_2$ equivalent to that in the present third embodiment, it is acceptable to reduce the space between the surface layer 131 and the inner layer 132 so as to be narrower than the space between the inner layer 132 and the inner layer 133, in place of differentiating the dielectric constants of the dielectrics from each other. In addition, in order to enhance the capacitance $C_2$ more effectively, it is also acceptable to employ the dielectric 135 having a relatively higher dielectric constant and to reduce the space between the surface layer 131 and the inner layer 132 so as to be relatively narrower.

Fourth Embodiment

Figure 9:
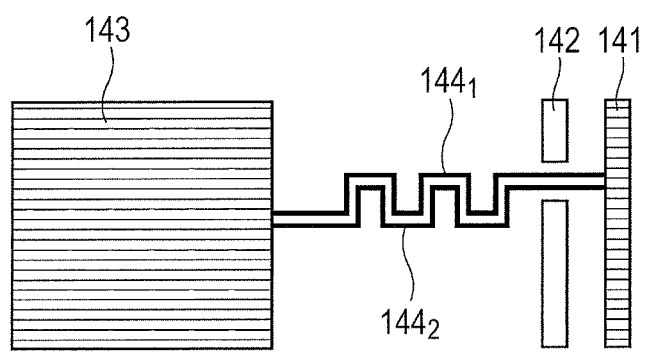
FIG. 9 is a schematic view illustrating an interposer in a semiconductor package of a printed circuit board according to a fourth embodiment.

Next, a printed circuit board according to a fourth embodiment of the present invention will be described below. FIG. 9 is a schematic view illustrating an interposer (substrate) in a semiconductor package of the printed circuit board according to the fourth embodiment of the present invention. Incidentally, in the present fourth embodiment, configurations similar to those in the above described first embodiment are designated by the same reference numerals, and the description will be omitted.

In the above described first embodiment, the case has been described where one conductor pattern 144 is formed, but a plurality of conductor patterns 144 may be formed.

In the present fourth embodiment, a power supply conductor pattern 141 and a conductor pattern 143 are electrically connected to each other by a plurality (two) of conductor patterns $144_1$ and $144_2$.

Thus, the plurality of conductor patterns $144_1$ and $144_2$ (wirings) which has the same potential is arranged in parallel with each other, and thereby a wiring resistance per unit length with respect to the inductance can be reduced. Therefore, the power supply impedance can be reduced more effectively, and the fluctuation of the power supply voltage can be suppressed more effectively.

In addition, in the present fourth embodiment, the conductor patterns $144_1$ and $144_2$ are formed into a meander-shape. Accordingly, the inductance $L_2$ can be effectively increased with a small dedicated area.

Incidentally, in the present fourth embodiment, the case has been described where there are two conductor patterns 144, but there may be three or more conductor patterns 144.

Fifth Embodiment

Figure 10A:
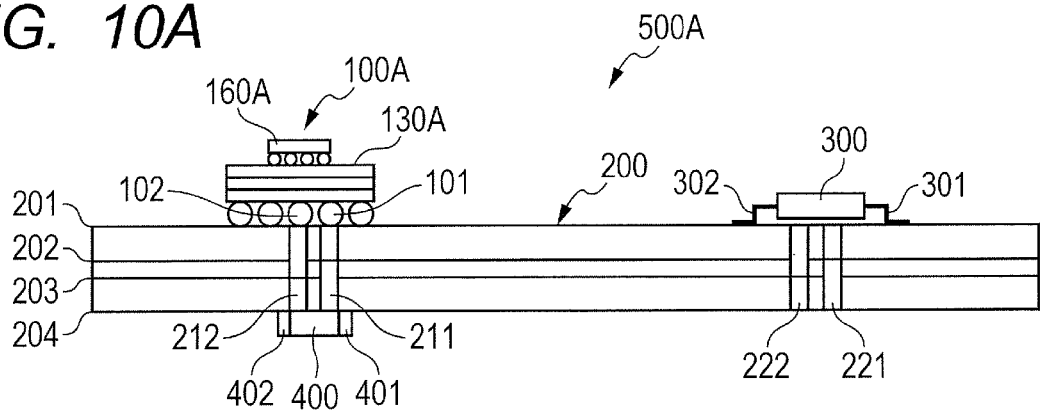
FIGS. 10A, 10B and 10C are explanatory views illustrating a schematic structure of a printed circuit board having a semiconductor package according to a fifth embodiment.
Figure 10B:
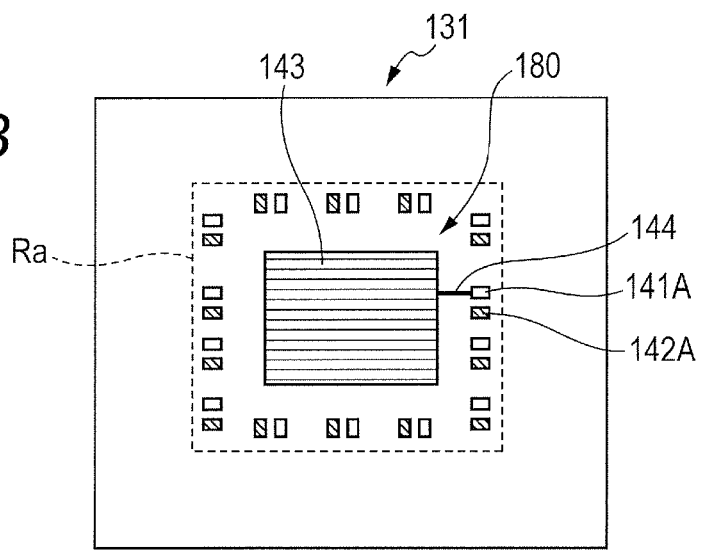
Figure 10C:
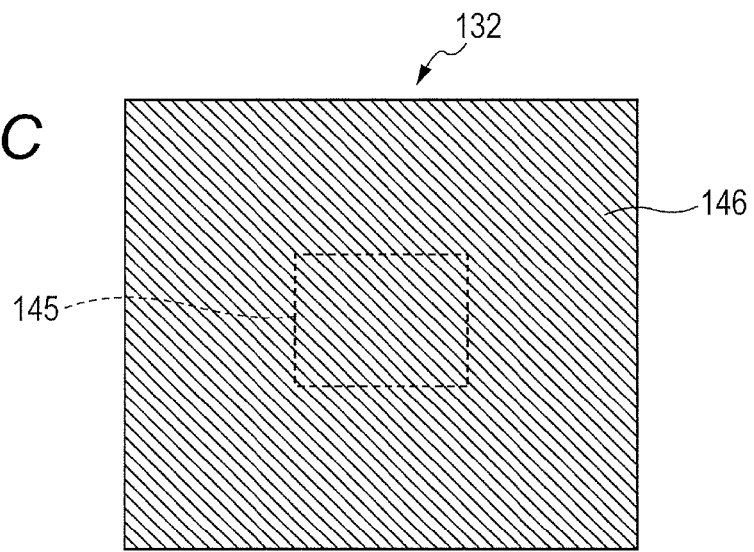

Next, a printed circuit board according to a fifth embodiment of the present invention will be described below. FIG. 10A to FIG. 10C are explanatory views illustrating a schematic structure of the printed circuit board having a semiconductor package according to the fifth embodiment of the present invention. Incidentally, in the present fifth embodiment, configurations similar to those in the above described first embodiment are designated by the same reference numerals, and the description will be omitted.

FIG. 10A is a cross-sectional view of a printed circuit board 500A. FIG. 10B is a plan view of a surface layer 131 which is a first conductor layer of a substrate 130A of a semiconductor package 100A; and FIG. 10C is a plan view of an inner layer 132 which is a second conductor layer of the substrate 130A of the semiconductor package 100A.

The printed circuit board 500A comprises a printed wiring board 200, a power supply circuit 300 which is mounted on the printed wiring board 200, and a bypass capacitor 400 which is mounted on the printed wiring board 200, similarly to the above described first embodiment. In addition, the printed circuit board 500A comprises a semiconductor package 100A which is mounted on the printed wiring board 200 and has a configuration different from that of the semiconductor package 100 of the above described first embodiment.

The semiconductor package 100A is a semiconductor package of, for instance, a BGA (Ball grid array) type, and is mounted on the surface layer 201 of the printed wiring board 200, similarly to the above described first embodiment.

The semiconductor package 100A comprises an interposer (which is also referred to as package substrate, and is hereafter referred to simply as "substrate") 130A, and an LSI (Large-Scale Integration) 160A which is a semiconductor element mounted on the substrate 130A.

The LSI 160A is a peripheral type of flip chip, and has a plurality of power terminals and a plurality of ground terminals which are solder bumps.

The substrate 130A is a multilayer substrate which has the surface layer 131 that is the first conductor layer, and the inner layer 132 which is the second conductor layer that is adjacent to the surface layer 131 through the dielectric, similarly to the above described first embodiment.

The substrate 130A has a plurality of power supply pads 141A which is a first conductor pattern that is formed in the surface layer 131, and to which the power terminals of the LSI 160A are connected, respectively. In addition, the substrate 130A has a plurality of ground pads 142A which is formed in the surface layer 131, and to which the ground terminals of the LSI 160A are connected, respectively.

In addition, the substrate 130A has a conductor pattern 143 which is a second conductor pattern that is formed in the surface layer 131 and is arranged while being separated from the power supply pads 141A and the ground pads 142A, similarly to the above described first embodiment. In addition, the substrate 130A has a conductor pattern 144 that is a third conductor pattern which is formed in the surface layer 131 so as to have a wiring width thinner than that of the conductor pattern 143, and electrically connects the power supply pad 141A with the conductor pattern 143, similarly to the above described first embodiment. In addition, the substrate 130A has a ground conductor pattern 146 that is formed in the inner layer 132 and has a conductor pattern 145 which is a fourth conductor pattern, faces the conductor pattern 143 through the dielectric, and is connected to the ground pads 142A through not-illustrated vias and the like.

The conductor pattern 143 is arranged in a position at which the conductor pattern 143 faces the LSI 160A, similarly to the above described first embodiment. In other words, the conductor pattern 143 is arranged on a projected region Ra which corresponds to the LSI 160A projected onto the surface layer 131.

These conductor patterns 143, 144 and 145 constitute the pattern unit 180, similarly to the above described first embodiment.

As described above, according to the present fifth embodiment, the power supply impedance is reduced by a series resonant circuit which includes the pattern unit 180, similarly to the above described first embodiment, and the fluctuation of the power supply voltage can be suppressed.

Sixth Embodiment

Figure 11:
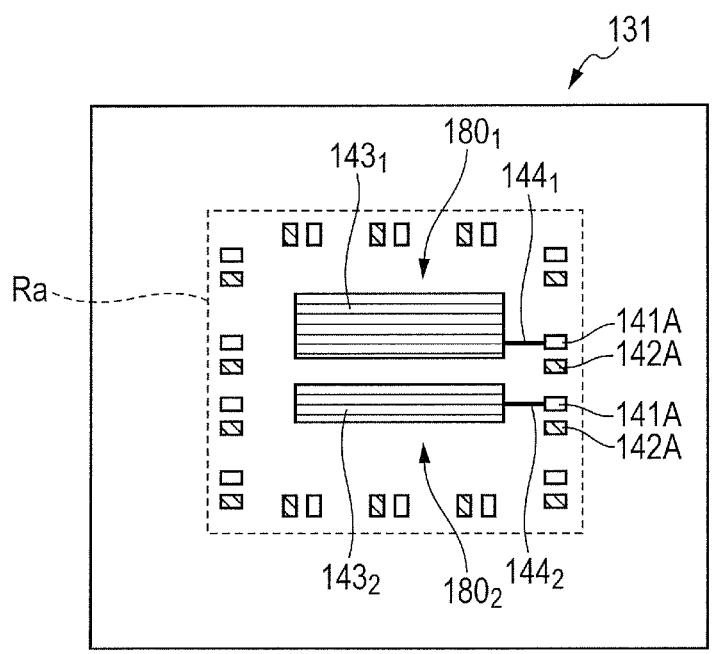
FIG. 11 is a plan view illustrating a first conductor layer of an interposer in a semiconductor package of a printed circuit board according to a sixth embodiment.

Next, a printed circuit board according to a sixth embodiment of the present invention will be described below. FIG. 11 is a plan view illustrating a first conductor layer of an interposer (substrate) in a semiconductor package of the printed circuit board according to the sixth embodiment of the present invention. Incidentally, in the present sixth embodiment, configurations similar to those in the above described first embodiment are designated by the same reference numerals, and the description will be omitted.

In the above described fifth embodiment, the case has been described where the substrate of the semiconductor package has one pattern unit 180, but the substrate may have a plurality of pattern units 180. In the present sixth embodiment, the substrate has a plurality (two) of pattern units $180_1$ and $180_2$, similarly to the above described second embodiment.

At this time, the conductor patterns $144_1$ and $144_2$ may be connected to different power supply pads 141A, respectively, as is illustrated in FIG. 11, or may also be connected to the same power supply pad 141A, though the illustration is omitted.

Thus, the pattern units $180_1$ and $180_2$ which form the LC circuit can be applied similarly to the LSI which is the peripheral type of flip chip as well.

Seventh Embodiment

Figure 12A:
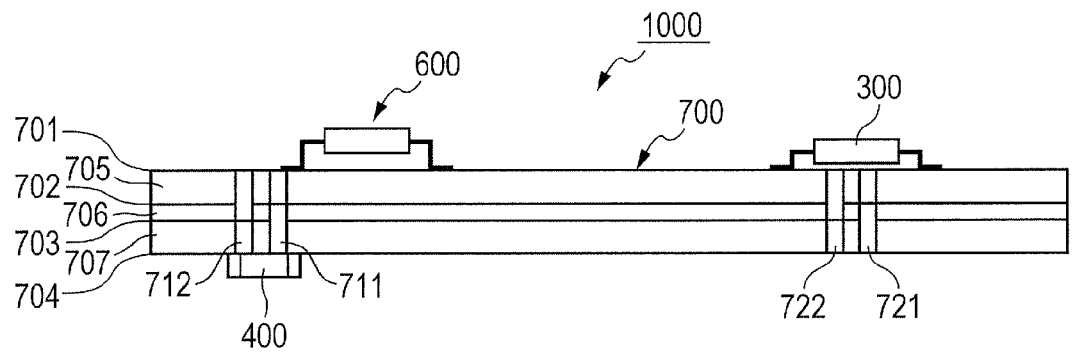
FIGS. 12A, 12B and 12C are explanatory views illustrating a schematic structure of a printed circuit board having a semiconductor package according to a seventh embodiment.
Figure 12B:
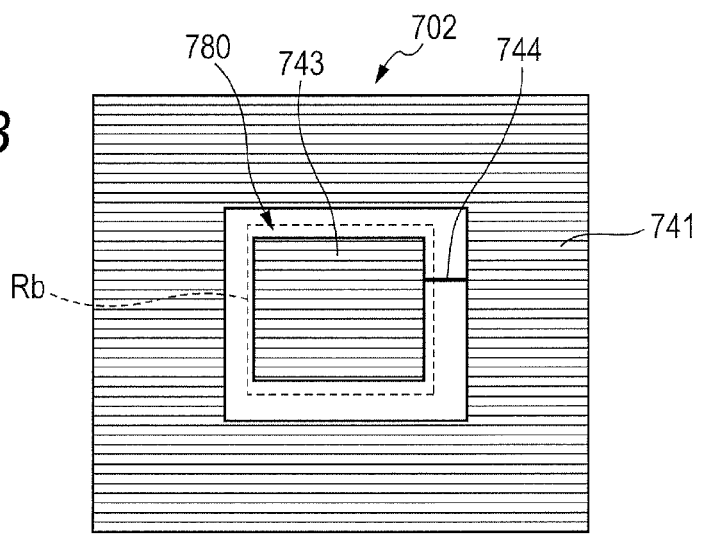
Figure 12C:
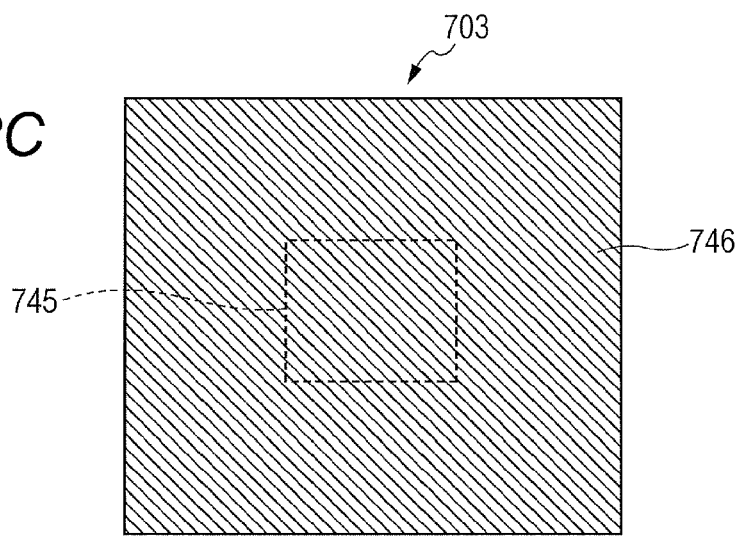

Next, a printed circuit board according to a seventh embodiment of the present invention will be described below. FIG. 12A to FIG. 12C are explanatory views illustrating a schematic structure of the printed circuit board which has a semiconductor package according to the seventh embodiment of the present invention. FIG. 12A is a cross-sectional view of the printed circuit board. FIG. 12B is a plan view of a first conductor layer of the printed wiring board. FIG. 12C is a plan view of a second conductor layer of the printed wiring board.

In the above described first to sixth embodiments, the case has been described where a pattern unit is formed on the substrate of the semiconductor package, but in the present seventh embodiment, the case will be described where the pattern unit is formed on the printed wiring board, on which the semiconductor package is mounted.

A printed circuit board 1000 comprises a printed wiring board 700, a semiconductor package 600 which is mounted on the printed wiring board 700, a power supply circuit 300 and a bypass capacitor 400 which are mounted on the printed wiring board 700 and have similar configurations to those in the above described first embodiment.

The printed wiring board 700 that is a mother board is a multilayer (four layers) substrate in which a surface layer 701, a surface layer 704 arranged in an opposite side to the surface layer 701, and a plurality of inner layers 702 and 703 arranged between the surface layer 701 and the surface layer 704 are stacked while having dielectrics (insulators) 705, 706 and 707 interposed therebetween. Each of the layers 701, 702, 703 and 704 is a conductor layer in which a conductor is arranged.

The inner layer 702 is the conductor layer which is adjacent to the surface layer 701 through the dielectric 705, and the inner layer 703 is the conductor layer which is arranged in the opposite side to the side of the surface layer 701 across the inner layer 702 and is adjacent to the inner layer 702 through the dielectric 706. The surface layer 704 is the conductor layer which is arranged in the opposite side to the side of the inner layer 702 across the inner layer 703 and is adjacent to the inner layer 703 through the dielectric 707. In the present seventh embodiment, the inner layer 702 is the first conductor layer, the inner layer 703 is the second conductor layer, and the surface layer 704 is a third conductor layer. In addition, in the present seventh embodiment, the dielectric 706 is a first dielectric and the dielectric 707 is a second dielectric.

The semiconductor package 600 is a semiconductor package of, for instance, a QFP (Quad Flat Package) type, and is mounted on the surface layer 701 of the printed wiring board 700. The power supply circuit 300 is mounted on the surface layer 701 of the printed wiring board 700, and the bypass capacitor 400 is mounted on the surface layer 704 of the printed wiring board 700.

The printed wiring board 700 has a power supply conductor pattern 741 that is a first conductor pattern which is formed in the inner layer 702, and is electrically connected to one terminal out of a power terminal and a ground terminal of the semiconductor package 600, in the present seventh embodiment, to the power terminal. In addition, the printed wiring board 700 has a ground conductor pattern 746 which is formed in the inner layer 703, and is electrically connected to the other terminal out of the power terminal and the ground terminal of the semiconductor package 600, in the present seventh embodiment, to the ground terminal.

Specifically, the printed wiring board 700 has through-hole vias 711 and 721 formed therein which are electrically connected to the power supply conductor pattern 741 of the inner layer 702, and through-hole vias 712 and 722 which are electrically connected to the ground conductor pattern 746 of the inner layer 703. The through-hole vias 711 and 712 are arranged in the vicinity of the semiconductor package 600, and the through-hole vias 721 and 722 are arranged in the vicinity of the power supply circuit 300. The power terminal of the semiconductor package 600 is electrically connected to the through-hole via 711 through a not-illustrated conductor pattern of the surface layer 701, and the ground terminal of the semiconductor package 600 is electrically connected to the through-hole via 712 through the not-illustrated conductor pattern of the surface layer 701. Thereby, the power terminal of the semiconductor package 600 is electrically connected to the power supply conductor pattern 741, and the ground terminal of the semiconductor package 600 is electrically connected to the ground conductor pattern 746.

In addition, the power terminal of the power supply circuit 300 is electrically connected to the through-hole via 721 through the not-illustrated conductor pattern of the surface layer 701, and the ground terminal of the power supply circuit 300 is electrically connected to the through-hole via 722 through the not-illustrated conductor pattern of the surface layer 701.

Accordingly, the power terminal of the power supply circuit 300 and the power terminal of the semiconductor package 600 are electrically connected to each other through the through-hole vias 711 and 721, the power supply conductor pattern 741 and the like which constitute a power line of the printed wiring board 700. In addition, the ground terminal of the power supply circuit 300 and the ground terminal of the semiconductor package 600 are electrically connected to each other through the through-hole vias 712 and 722, the ground conductor pattern 746 and the like which constitute a ground line of the printed wiring board 700.

The bypass capacitor 400 is arranged in the vicinity of the semiconductor package 600, in other words, in the vicinity of the vias 711 and 712. In the bypass capacitor 400, one terminal is electrically connected to the power line (via 711 in FIG. 12A) of the printed wiring board 700, and the other terminal is electrically connected to the ground line (via 712 in FIG. 12A) of the printed wiring board 700.

In the present seventh embodiment, the printed wiring board 700 has a conductor pattern 743 which is a second conductor pattern that is formed in the inner layer 702 and is arranged while being separated from the power supply conductor pattern 741. In addition, the printed wiring board 700 has a conductor pattern 744 which is a third conductor pattern that is formed in the inner layer 702 so as to have a wiring width thinner than that of the conductor pattern 743, and electrically connects the power supply conductor pattern 741 with the conductor pattern 743. The ground conductor pattern 746 which is formed in the inner layer 703 has a conductor pattern 745 which is a fourth conductor pattern that faces the conductor pattern 743 through the dielectric 706, and is electrically connected to the other terminal out of the power terminal and the ground terminal of the semiconductor package 600. In other words, the conductor pattern 745 is a part of the ground conductor pattern 746.

The conductor pattern 745 is a conductor pattern formed in a projected region which corresponds to the conductor pattern 743 projected onto the inner layer 703. A pair of these conductor patterns 743 and 745 functions as a parallel flat-plate capacitor which has mainly a capacitance component (C component) and a resistance component (R component).

In addition, the conductor pattern 744 is a linear conductor pattern, and the wiring width is narrower than a wiring width of the conductor pattern 743. Accordingly, the conductor pattern 744 functions as an inductor which has mainly an inductance component (L component) and the resistance component (R component).

In other words, the printed wiring board 700 has a pattern unit 780 which constitutes a series resonant circuit that is formed of the conductor patterns 743, 744 and 745 and has LCR components.

In the present seventh embodiment, the conductor pattern 743 is arranged in a position at which the conductor pattern 743 faces the LSI 600. In other words, the conductor pattern 743 is arranged so that a part or the whole of the conductor pattern 743 (whole in FIG. 12A) exists in the projected region Rb which corresponds to the LSI 600 projected onto the inner layer 702. Thereby, it becomes unnecessary to secure a region for providing the conductor pattern 743 in another region than the projected region Rb in the inner layer 702, which enables the miniaturization of the sizes of not only the printed wiring board 700 but also the printed circuit board 1000 to be maintained.

The resonance frequency of the above pattern unit 780 which forms the series resonant circuit is brought close to the anti-resonance frequency caused by the semiconductor package 600, the printed wiring board 700 and the bypass capacitor 400. Thereby the power supply impedance in the anti-resonance can be reduced. Thereby, the fluctuation of the power supply voltage can be suppressed.

In addition, in the present seventh embodiment, if a ratio of a self-resonant frequency to the anti-resonance frequency is controlled to be not less than 0.5 and not more than 1.5 similarly to the above described first embodiment, such an effect can be obtained that a reduction ratio of the power supply impedance is 10% or more, in other words, the reduction ratio of the fluctuation of the power supply voltage is 10% or more.

In addition, in the present seventh embodiment, a dielectric constant of the dielectric 706 may be set so as to be larger than the dielectric constant of the dielectric 707. Thereby, such an effect is obtained as to increase a capacitance value between the conductor patterns 743 and 745 per unit area. Accordingly, the areas of the conductor patterns 743 and 745 can be reduced, and a desired capacitance value can be secured even if the space is saved.

In addition, in order to obtain an effect of enhancing the capacitance $C_2$ between the conductor patterns 743 and 745, it is acceptable to reduce the space between the inner layer 702 and the inner layer 703 so as to be narrower than the space between the inner layer 703 and the surface layer 704, in place of differentiating the dielectric constants of the dielectrics between the conductor patterns. Furthermore, in order to enhance the capacitance $C_2$ more effectively, it is also acceptable to employ the dielectric 706 having a relatively higher dielectric constant and to reduce the space between the inner layer 702 and the inner layer 703 so as to be relatively narrower.

Eighth Embodiment

Figure 13A:
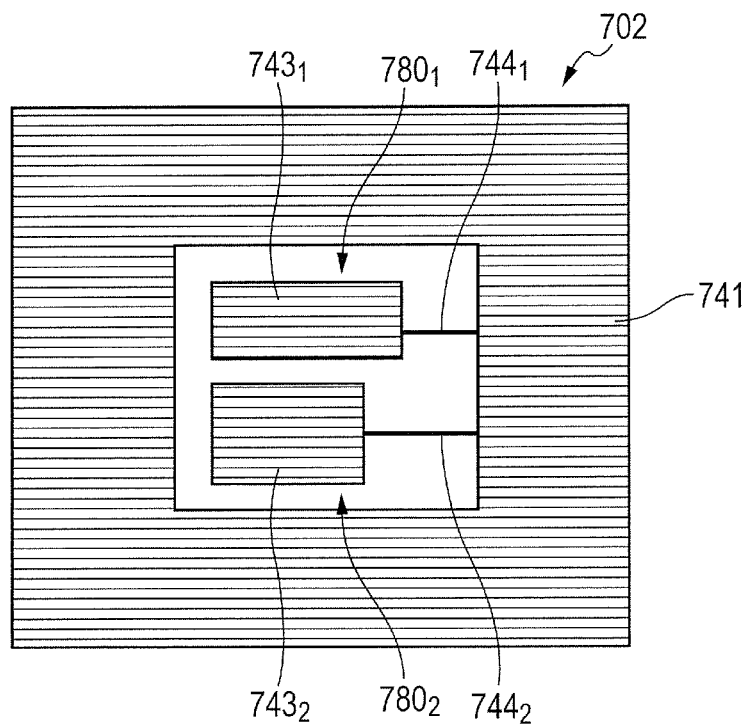
FIGS. 13A and 13B are schematic views illustrating a printed wiring board of a printed circuit board according to an eighth embodiment.
Figure 13B:
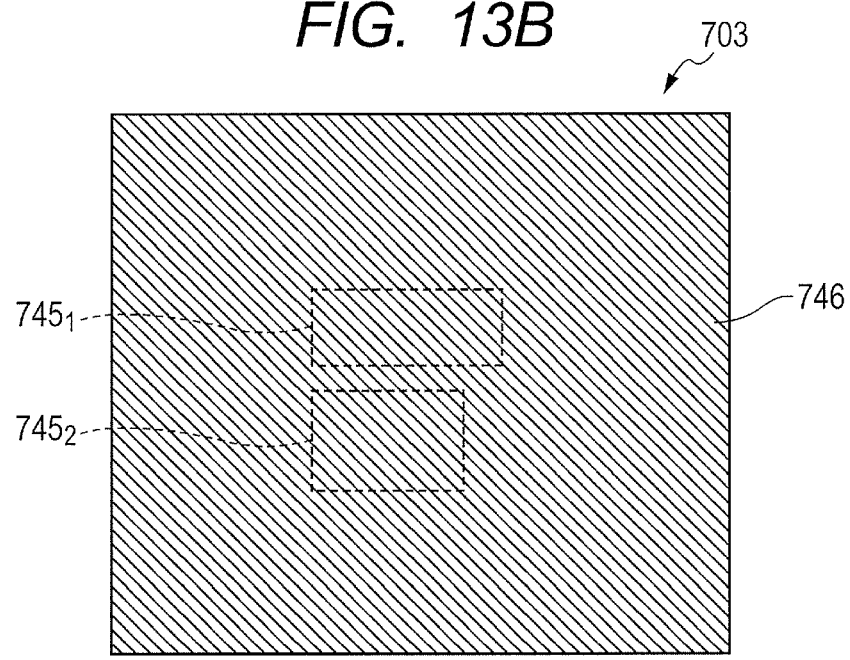

Next, a printed circuit board according to an eighth embodiment of the present invention will be described below. FIG. 13A and FIG. 13B are schematic views illustrating the printed wiring board of the printed circuit board according to the eighth embodiment of the present invention. Incidentally, in the present eighth embodiment, configurations similar to those in the above described seventh embodiment are designated by the same reference numerals, and the description will be omitted. FIG. 13A is a plan view of an inner layer 702 which is a first conductor layer of the printed wiring board; and FIG. 13B is a plan view of an inner layer 703 which is a second conductor layer of the printed wiring board.

In the above described seventh embodiment, the case has been described where one pattern unit 780 is formed, but a plurality of pattern units 780 may be formed. In the present eighth embodiment, two pattern units $780_1$ and $780_2$ are formed.

The pattern unit $780_1$ has a conductor pattern $743_1$ of a second conductor pattern, a conductor pattern $744_1$ of a third conductor pattern, and a conductor pattern $745_1$ of a fourth conductor pattern. In addition, the pattern unit $780_2$ has a conductor pattern $743_2$ of a second conductor pattern, a conductor pattern $744_2$ of a third conductor pattern, and a conductor pattern $745_2$ of a fourth conductor pattern.

Each of the pattern units $780_1$ and $780_2$ can be formed so as to have a mutually different resonance frequency. For instance, each of the pattern units $780_1$ and $780_2$ may be formed so as to have mutually different capacitance $C_2$, so as to have mutually different inductance $L_2$, or so as to have mutually different $C_2$ and $L_2$ at the same time. When it is described in full detail, an area in which the conductor pattern $743_1$ faces the conductor pattern $745_1$ and an area in which the conductor pattern $743_2$ faces the conductor pattern $745_2$ may be differentiated from each other, the spaces between the conductor patterns may be differentiated from each other, or the dielectric constants of the dielectrics between the conductor patterns may be differentiated from each other. In addition, the wiring length of the conductor pattern $744_1$ and the wiring length of the conductor pattern $744_2$ may also be differentiated from each other.

Thus, when the resonance frequencies of each of the pattern units $780_1$ and $780_2$ are differentiated from each other, a wide band in which the power supply impedance is reduced can be secured and the fluctuation of the power supply voltage can be more effectively suppressed. Incidentally, in the present eighth embodiment, two pattern units 780 have been provided, but there may exist three or more pattern units 780.

In addition, in the present eighth embodiment, the plurality of conductor patterns $745_1$ and $745_2$ is integrally formed of one plane-shaped conductor. More specifically, the plurality of conductor patterns $745_1$ and $745_2$ is integrally formed in one ground conductor pattern 746. Accordingly, the potential (ground potential) in each of the conductor patterns $745_1$ and $745_2$ is stabilized, and the fluctuation of the power supply voltage can be effectively suppressed.

Ninth Embodiment

Figure 14:
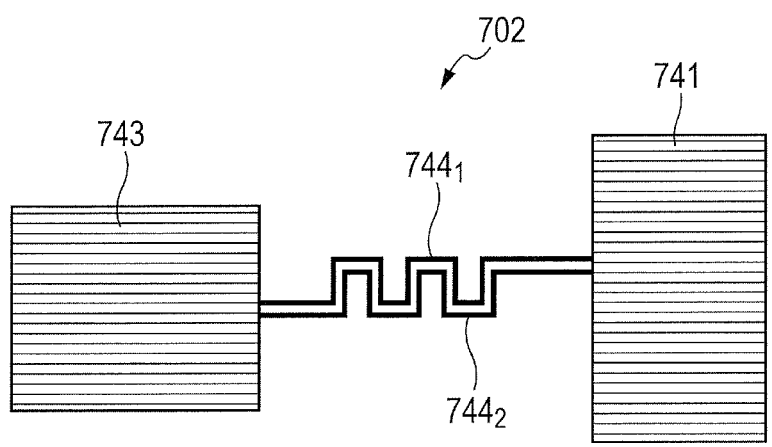
FIG. 14 is a schematic view illustrating a printed wiring board of a printed circuit board according to a ninth embodiment.

Next, a printed circuit board according to a ninth embodiment of the present invention will be described below. FIG. 14 is a schematic view illustrating the printed wiring board of the printed circuit board according to the ninth embodiment of the present invention. Incidentally, in the present ninth embodiment, configurations similar to those in the above described seventh embodiment are designated by the same reference numerals, and the description will be omitted.

In the above described seventh embodiment, the case has been described where one conductor pattern 744 is formed, but a plurality of conductor patterns 744 may be formed.

In the present ninth embodiment, a power supply conductor pattern 741 and a conductor pattern 743 are electrically connected to each other by a plurality (two) of conductor patterns $744_1$ and $744_2$.

Thus, the plurality of conductor patterns $744_1$ and $744_2$ (wirings) which have the same potential are arranged in parallel with each other, and thereby a wiring resistance per unit length with respect to the inductance can be reduced. Therefore, the power supply impedance can be reduced more effectively, and the fluctuation of the power supply voltage can be suppressed more effectively.

In addition, in the present ninth embodiment, the conductor patterns $744_1$ and $744_2$ are formed into a meander-shape. Accordingly, the inductance $L_2$ can be effectively increased with a small dedicated area.

Incidentally, in the present ninth embodiment, the case has been described where there are two conductor patterns 744, but there may be three or more conductor patterns 744.

The present invention is not limited to the embodiments described above, and can be variously modified within a technological idea of the present invention by those who have an ordinary knowledge in the field.

In the above described first and seventh embodiments, the conductor patterns 144 and 744 have been formed into a straight shape, respectively, but may be formed into a meander-shape.

In addition, in the above described first to sixth embodiments, the case has been described where the first conductor layer is the surface layer 131, but the first conductor layer may be an inner layer. Similarly, in the above described seventh to ninth embodiments, the case has been described where the first conductor layer is the inner layer 702, but the first conductor layer may be a surface layer.

In addition, in the above described first to sixth embodiments, the case has been described where the conductor pattern 144 which is the third conductor pattern is connected to the power supply conductor pattern 141, but the case is also acceptable where the conductor pattern 144 is connected to the ground conductor pattern 142. In this case, the ground conductor pattern 142 is the first conductor pattern, and the fourth conductor pattern which is connected to the power supply conductor pattern 141 by the via and the like shall be arranged in the second conductor layer that is adjacent to the first conductor layer.

In addition, in the above described seventh to ninth embodiments, the case has been described where the conductor pattern 744 which is the third conductor pattern is connected to the power supply conductor pattern 741, but the case is not limited to the above case. The case is also acceptable where the conductor pattern 744 is connected to the ground conductor pattern which is electrically connected to the ground terminal of the semiconductor package 600. In this case, the ground conductor pattern is the first conductor pattern, and the fourth conductor pattern which is electrically connected to the power terminal of the semiconductor package 600 shall be arranged in the second conductor layer that is adjacent to the first conductor layer.

In addition, in the above described first to sixth embodiments, the case has been described where the interposer (package substrate) and the printed wiring board have four layers, respectively, but the interposer and the printed wiring board may have two or more layers and one or more layers, respectively. In addition, in the above described seventh to ninth embodiments, the case has been described where the printed wiring board has four layers, but the printed wiring board may have two or more layers.

In addition, in the above described first to ninth embodiments, the case has been described where a pattern unit is formed for one power supply potential, but the pattern unit may be formed for each of a plurality of power supply potentials.

In addition, in the above described seventh to ninth embodiments, a QFP type of semiconductor package has been described as an example of a semiconductor package, but the semiconductor package is not limited to the QFP type. The embodiments can be applied to a semiconductor package which has a connecting terminal existing in a periphery of a semiconductor package body, such as a QFN (Quad Flat Nolead Package) type and a DIP (Dual Inline Package) type.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-049835, filed Mar. 13, 2013, which is hereby incorporated by reference herein in its entirety.

What is claimed is:

1. A semiconductor package comprising:

an interposer; and a semiconductor element mounted on the interposer, wherein the interposer comprises a plurality of conductor layers comprising:

a first conductor layer having:

a first conductor pattern which is electrically connected to one terminal out of a power terminal and a ground terminal of the semiconductor element;

a second conductor pattern which is arranged while being separated from the first conductor pattern; and a third conductor pattern which is formed so as to have a wiring width thinner than that of the second conductor pattern, and connects the first conductor pattern with the second conductor pattern; and a second conductor layer, which is adjacent to the first conductor layer through a first dielectric, having:

a fourth conductor pattern which faces the second conductor pattern through the first dielectric and is electrically connected to the other terminal out of the power terminal and the ground terminal of the semiconductor element.

2. The semiconductor package according to claim 1, wherein a pattern unit which is formed of the second conductor pattern, the third conductor pattern and the fourth conductor pattern constitutes a series resonant circuit that corresponds to an operating frequency of the semiconductor element.

3. The semiconductor package according to claim 1, wherein the second conductor pattern is arranged in a projected region which corresponds to the semiconductor element projected onto the first conductor layer.

4. The semiconductor package according to claim 1, comprising:

a plurality of pattern units each of which is formed of the second conductor pattern, the third conductor pattern and the fourth conductor pattern, wherein the pattern units constitute respective series resonant circuits which correspond to frequencies that are different from each other, respectively.

5. The semiconductor package according to claim 1, wherein the third conductor pattern is formed into a meander-shape.

6. The semiconductor package according to claim 1, wherein the interposer further comprises a third conductor layer which is adjacent to the second conductor layer through a second dielectric, and the first dielectric has a dielectric constant larger than that of the second dielectric.

7. The semiconductor package according to claim 1, wherein the interposer comprises a third conductor layer which is adjacent to the second conductor layer through a second dielectric, and a space between the first conductor layer and the second conductor layer is narrower than a space between the second conductor layer and the third conductor layer.

* * * * *